United States Patent [19]
Rupp

[11] Patent Number: 6,091,094
[45] Date of Patent: Jul. 18, 2000

[54] VERTICAL DEVICE FORMED ADJACENT TO A WORDLINE SIDEWALL AND METHOD FOR SEMICONDUCTOR CHIPS

[75] Inventor: Thomas S. Rupp, Stormville, N.Y.

[73] Assignee: Siemens Aktiengesellschaft, Munich, Germany

[21] Appl. No.: 09/095,793

[22] Filed: Jun. 11, 1998

[51] Int. Cl.[7] .......................... H01L 27/108; H01L 29/76; H01L 29/94; H01L 31/119; H01L 21/8242
[52] U.S. Cl. .......................... 257/296; 257/298; 257/300; 257/301; 257/302; 257/304; 257/305; 438/242; 438/243
[58] Field of Search .................................. 257/296, 298, 257/300–305; 438/242, 243

[56] References Cited

U.S. PATENT DOCUMENTS

| | | |
|---|---|---|
| 4,959,698 | 9/1990 | Shinichi . |
| 5,160,987 | 11/1992 | Pricer et al. ............................. 257/307 |
| 5,519,236 | 5/1996 | Ozaki ..................................... 257/302 |
| 5,770,874 | 6/1998 | Egawa .................................... 257/296 |
| 5,831,301 | 11/1998 | Horak et al. ............................ 257/302 |
| 5,869,868 | 2/1999 | Rajeevakumar ....................... 257/350 |
| 5,895,946 | 4/1999 | Hamamoto et al. .................... 257/302 |
| 5,905,670 | 5/1999 | Babson et al. ......................... 365/105 |
| 6,034,389 | 3/2000 | Burns, Jr. et al. ...................... 257/301 |

*Primary Examiner*—David Hardy
*Assistant Examiner*—Allan R. Wilson
*Attorney, Agent, or Firm*—Donald B. Paschburg

[57] ABSTRACT

A semiconductor device includes a substrate forming a trench, the trench including a storage node disposed within the trench. A wordline is disposed within the substrate and adjacent to a portion of the substrate. A vertically disposed transistor is included wherein the wordline functions as a gate, the storage node and a bitline function as one of a source and a drain such that when activated by the wordline the transistor conducts between the storage node and the bitline. The invention further includes a method of fabricating the semiconductor device with vertical transistors.

17 Claims, 21 Drawing Sheets

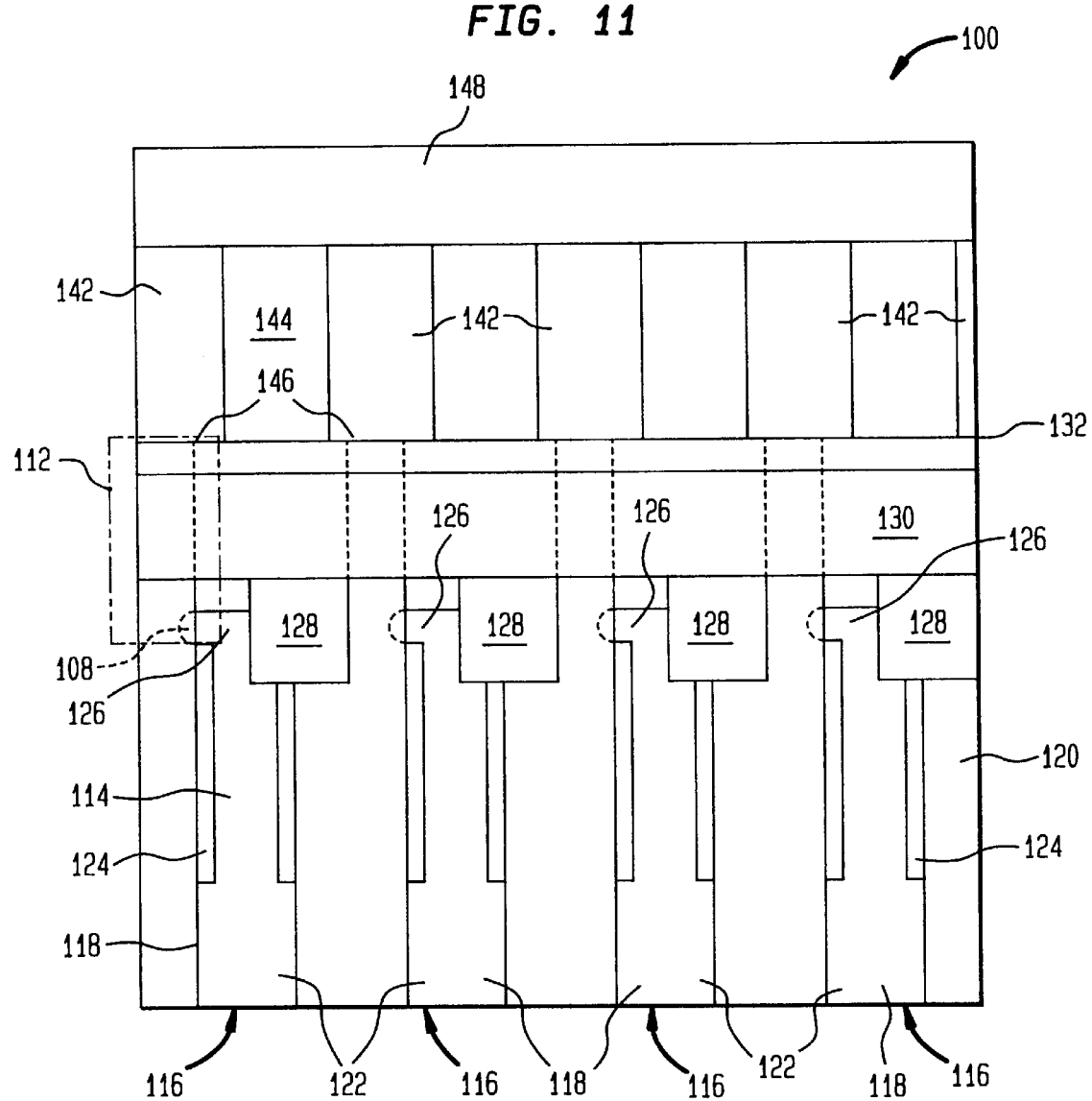

VERTICAL DEVICE FORMED ADJACENT TO A WORDLINE SIDEWALL AND METHOD FOR SEMICONDUCTOR CHIPS

BACKGROUND

1. Technical Field

This disclosure relates to semiconductor devices and more particularly, to a vertical device and method for conserving layout area on semiconductor chips.

2. Description of the Related Art

In the semiconductor industry, it is advantageous to reduce the size and increase component density on chips. Typically, the focus of miniaturization has been placed on the two-dimensional horizontal plane of a semiconductor device. With device sizes approaching less than 0.2 microns, the decrease in the horizontal dimensions of semiconductor devices has created problems in the operational characteristics of the devices.

To accommodate the conflicting trends of reduced size and increased component density, a need exists for a vertical device which reduces the amount of area occupied of the horizontal plane of the semiconductor device. Such a device would alleviate the conflicting trends. A further need exists for an arrangement of cells in a semiconductor device layout such that an increased density of cells is provided.

SUMMARY OF THE INVENTION

A semiconductor device includes a substrate forming a trench, the trench including a storage node disposed within the trench. A wordline is disposed within the substrate and adjacent to a portion of the substrate. A vertically disposed transistor is included wherein the wordline functions as a gate, the storage node and a bitline function as one of a source and a drain such that when activated by the wordline the transistor conducts between the storage node and the bitline.

In alternate embodiments of the semiconductor device, a contact may be included for electrically connecting the bitline to the transistor. The contact may electrically connect to the transistor at a contact area and the contact area may include one of a silicide and a salicide. A buried strap may be included for accessing the storage node by the transistor wherein the buried strap is oriented substantially perpendicular to the wordline or the buried strap is oriented substantially parallel to the wordline. The wordline may further include a center region with increased conductivity relative to an outer region of the wordline. An active area may be included adjacent to the wordline for conducting between the bitline and the storage node. The active area may be utilized by at least one transistor.

In a memory cell array for a DRAM chip, each memory cell includes a vertically disposed transistor having an active area for accessing a storage node within a trench of each memory cell. A contact couples the transistor to a bitline wherein the trench, the active area and the contact have approximately same shapes for improving processing of the DRAM chip.

In alternate embodiments, the memory cells are preferably arranged in a hexagonal pattern. Bitlines may be arranged in a zig-zag pattern, arranged in a diagonal pattern or arranged perpendicularly relative to wordlines. Each memory cell may have a cell area of about $4F^2$ where F is a minimum feature size of the DRAM chip.

A method of fabricating a semiconductor chip having vertically orientated transistors includes the steps of providing a substrate having trenches formed therein and a storage node disposed within each trench, forming a wordline within the substrate such that a vertical side of the wordline is coupled to a portion of the substrate and electrically coupling the portion of the substrate to the storage node and to a bitline such that current is permitted to flow between the storage node and the bitline when the wordline is activated.

In alternate methods, the step of forming a wordline may include the step of forming a center portion of the wordline with a higher conductivity than an outer portion of the wordline. The step of electrically coupling may include doping the portion of the substrate. The step of doping may be performed by ion implantation or outdiffusion from a doped area, e.g., from the storage node by tempering. The step of depositing a gate oxide on the portion of the substrate may be included. The step of electrically coupling the portion of the substrate to the storage node and to a bitline may include the step of forming a contact to connect the portion of the substrate to the bitline. The step of forming the contact to connect the portion of the substrate to the bitline may include providing one of a silicide and salicide between the contact and the portion of the substrate to improve conductivity. The portion of the substrate may include an active area and further comprise the step of forming the transistors to share the active area.

Another method of fabricating a semiconductor chip having trenches, vertically disposed active areas and bitline contacts includes the steps of providing a same shape for the trenches, the active areas and the bitline contacts and forming the trenches, the active areas and the bitline contacts using a same lithographic mask for the trenches, the active areas and the bitline contacts. Alternately, the method includes circular shapes. The step of forming may includes forming the trenches, the active areas and the bitline contacts using a same lithographic mask These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 11 is a cross-sectional view taken along section line 11—11 of FIG. 12 showing an alternate embodiment of a DRAM chip having vertical transistors with a buried strap disposed substantially parallel to wordlines in accordance with the present invention;

DETAILED DESCRIPTION OF PREFERRED EMBODIMENTS

This disclosure relates to semiconductor devices and more particularly, to a vertical device for conserving layout area on semiconductor chips. The vertical device is particularly useful in trench type dynamic random access memory (DRAM) chips, and the disclosure will describe the invention in detail with reference to DRAMs. However, the invention is broader and applies to other semiconductor devices including embedded DRAMs, application specific integrated circuits (ASICs), etc.

The present invention with reference to DRAMs includes memory cells with deep trench capacitors. The trench capacitors include buried wordlines which support the vertical device on a side wall of the buried wordline. The vertical device may be an access transistor for accessing a storage node of the trench capacitors. The device may be advantageously separated from the trench to reduce current leakage. Since the device is vertical there is virtually no device length limitation. Devices may be made larger by extending deeper in a substrate. Further, since the device is vertically oriented (parallel to the depth of the trench), the trench, an active area of the device and a bit line contact may be advantageously fabricated having a same lithographic shape. This simplifies processing.

In one aspect of the present invention an open bit line architecture may be implemented. This includes an individual active area for each vertical device or memory cell. This reduces any impact of surrounding devices on the operation of each cell. Another aspect of the present invention provides for two devices facing each other to share active areas.

Figure 1:
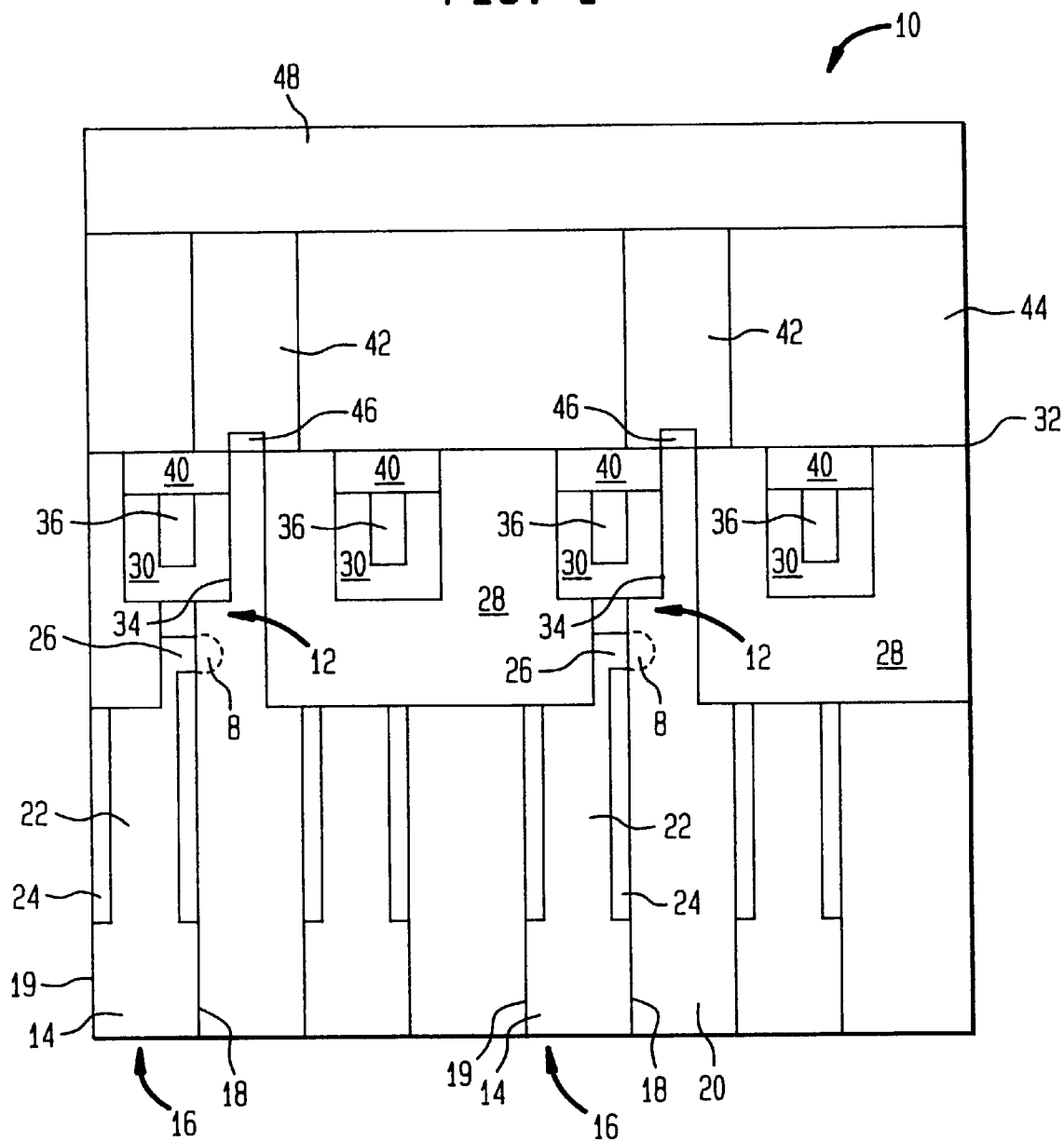
FIG. 1 is a cross-sectional view taken along section line 1—1 of FIG. 2 showing a DRAM chip having vertical transistors and a buried strap disposed substantially perpendicular to wordlines in accordance with the present invention.
Figure 2:
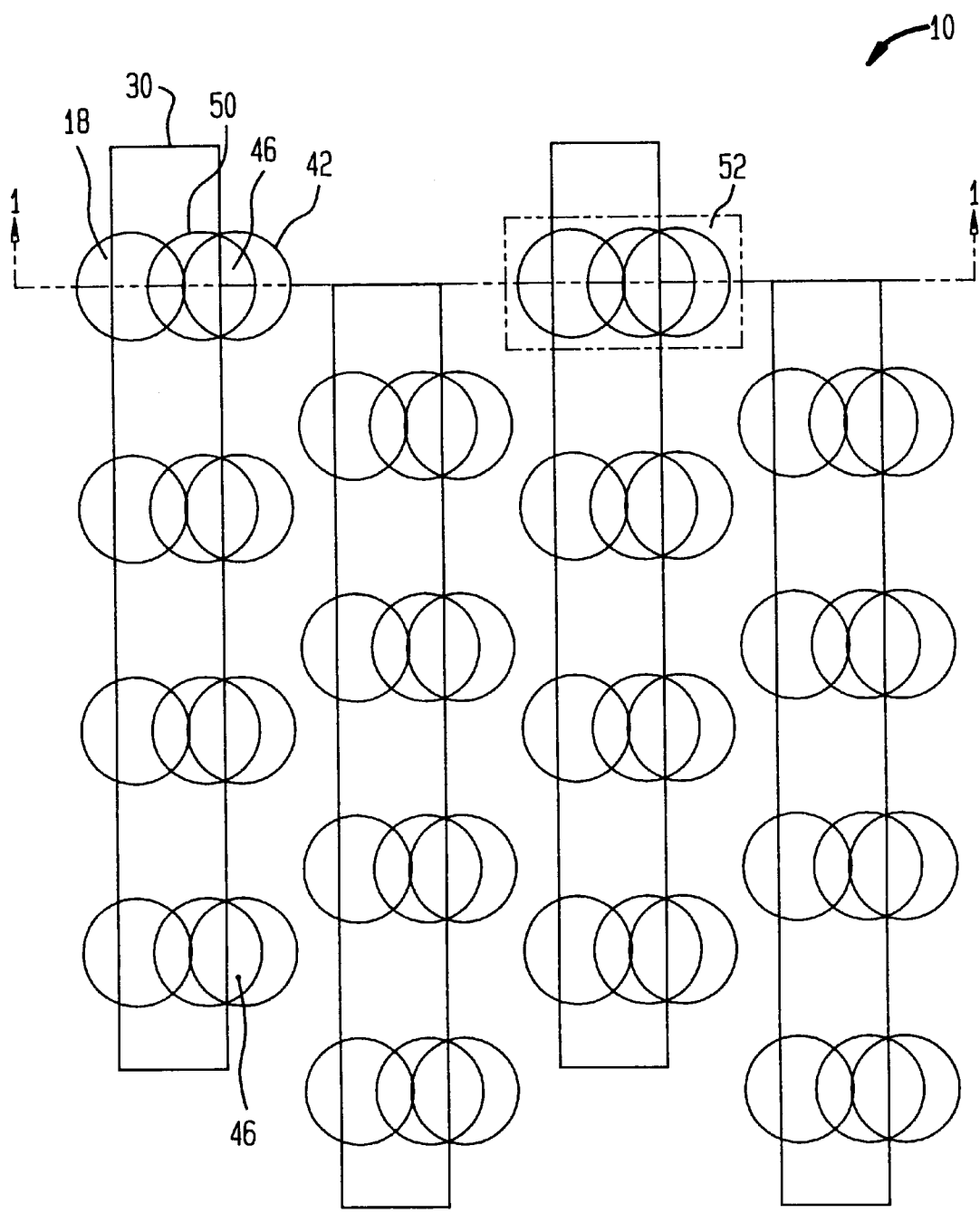
FIG. 2 is a plan view of the DRAM chip of FIG. 1 with components shown having substantially the same shape in accordance with the present invention.

Referring now in specific detail to the drawings in which like reference numerals identify similar or identical elements throughout the several views, FIG. 1 shows a cross-section, taken at section line 1—1 of FIG. 2, of a portion of a DRAM chip 10 in accordance with the present invention. DRAM chip 10 includes vertical transistors 12 for accessing storage nodes 14 of trench capacitors 16. Storage nodes 14 are formed by etching trenches 18 into a substrate 20. Substrate 20 is typically made from silicon, however other suitable materials may be used. Trenches 18 are filled with a filler material 22, preferably polycrystalline silicon (polysilicon or poly). Trenches 18 also have a collar 24 formed in an upper portion of each trench 18 and extending around interior walls of each trench 18. A thin dielectric 19 is formed in a lower portion of each trench between substrate 20 and storage node 14. Collar 24 is formed from dielectric material, preferable an oxide, for example silicon dioxide, silicon nitride or a combination of both. Thin dielectric layer 19 and collar 24 prevent charge leakage into substrate 20 from storage node 14 as well as discharge between an inner and outer part of the storage capacitor. A bottom portion of trench 18 also has a dielectric layer to electrically isolate storage node 14 at a lower end of trench 18.

A buried strap 26 electrically couples storage node 14 to vertical transistor 12. Buried strap 26 preferably includes polysilicon and further includes an outdiffusion region 8 formed by tempering. Shallow trench isolation 28 (STI) electrically isolates storage node 14 and buried strap 26 from active areas, other devices and metal lines. STI 28 includes a dielectric material, preferably an oxide, such as silicon dioxide. Wordlines 30 extend through DRAM chip 10. Word lines 30 are shown buried below a top surface 32 of substrate 20. Wordlines 30 function as a gate conductor (GC) for vertical transistors 12. Wordlines 30 are adjacent to substrate 20 on a sidewall 34. Wordlines 30 preferably include a more conductive center portion 36. In one embodiment, center portion includes a metal silicide, for example tungsten silicide, or a salicide (self-aligned silicide), for example tungsten salicide. Wordlines 30 are enclosed by a dielectric layer 40 which is preferably the same dielectric material as STI 28.

Bitline contacts 42 are formed within a dielectric layer 44. Bitline contacts 42 preferably include tungsten, aluminum or other suitable contact metals. Bitline contacts 42 couple to vertical transistor 12 at a contact area 46. In one embodiment, contact area 46 may include an additional material to increase conductivity, for example contact area 46 may include a silicide (tungsten, cobalt, titanium, etc.) which may be deposited as a salicide. In one embodiment, bitline contacts 42 may be formed simultaneously with support contacts (not shown). Support contacts could include contacts for logic circuitry for embedded DRAM or other circuitry, for example contact needed to connect wordlines 30 to higher metal layers. Bitline contacts 42 electrically connect bitlines 48 to vertical transistor 12.

Vertical transistor 12 conducts when enabled by wordline 30. Bitline 42 acts as a source (or drain) and storage node 14 acts as a drain (or source). When charge is to be stored in storage node 14, for example in a write operation, storage node 14 is brought to a lower potential by a power supply (not shown). Wordline 30 and bit line 42 are activated and vertical transistor 12 conducts between bitline 42 and storage node 14 (through buried strap 26) to charge storage node. Buried strap 26 is orthogonal oriented relative to wordline 30. Details on doping and formation of vertical transistor 12 in accordance with the present invention are described herein.

Referring to FIG. 2, a plan view of DRAM chip 10 is shown. Trenches 18, active areas 50 to define vertical transistors 12 and buried strap 26 (FIG. 1) and bitline contacts 42 are shown for a plurality of memory cells 52. Wordlines 30 are also indicated. The shapes of trenches 18, active areas 50 and bitline contacts 42 are approximately the same. In this way, a cell area of about $4F^2$ or less is achievable where F is a minimum feature size. Larger cell areas are contemplated as well. To achieve maximum density of memory cells 52, a hexagonal pattern is provided, however other patterns may be used. The shapes of trenches 18, active areas 50 and bitline contacts 42 being approximately the same permits same lithographic shapes for processing DRAM chip 10 and therefore simplifies processing and reduces costs. In a preferred embodiment, the shapes of trenches 18, active areas 50 and bitline contacts 42 are exactly the same and a same lithographic mask is used to form all shapes. This results in a substantial advantage in that lithographic tolerances can be much tighter and overlay is optimal due to the use of exactly the same shapes and alignment masks to form consecutive levels, that is one mask for a trench level, an active area level and a bit line contact level.

As shown in FIG. 2, each memory cell includes its own active area 50 forming an open bitline architecture. This architecture provides isolation from neighboring memory cell active areas and thereby reduces any impact therefrom. Other architectures take advantage of vertical transistors one such architecture is described below with reference to FIG. 22.

Figure 3:
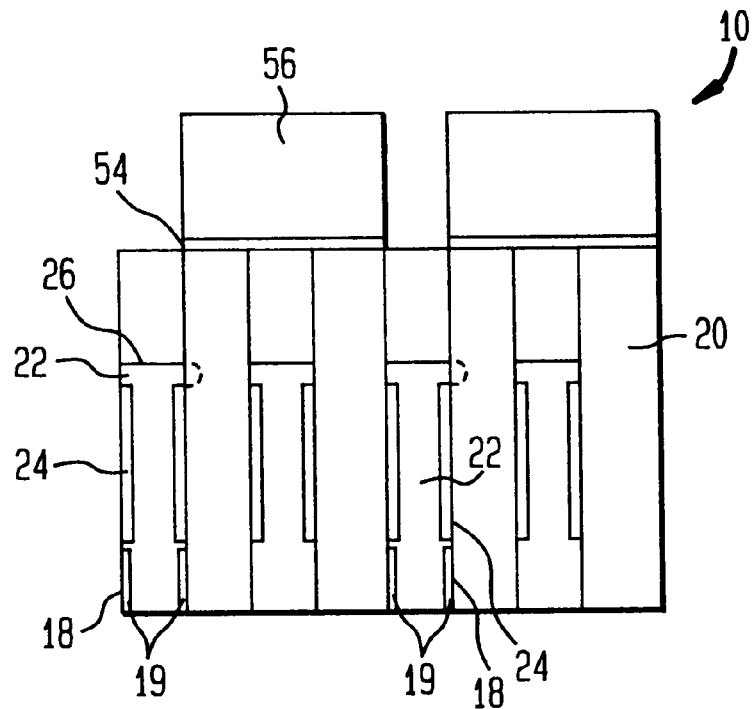
FIG. 3 is a cross-sectional view of a DRAM chip showing trenches formed and filled in accordance with the present invention.

Referring to FIG. 3, a structure is shown having trenches 18 etched, thin dielectric 19 and collars 24 formed and filler material 22 deposited within substrate 20. A thermal pad layer 54 and a pad layer 56 are formed on substrate 20 prior to trench 18 etching. Thermal pad layer 54 is preferably silicon dioxide formed by exposing silicon substrate 20 to oxygen at elevated temperatures. Pad layer 56 preferably includes silicon nitride. Pad layer 56 functions, among other things, as a mask to selectively etch trenches 18 in substrate 20 as is known to those skilled in the art. An additional hard mask layer may be used to form trenches 18, for example, a borosilicate glass (BSG) layer may be used as is known to those in the art. Filler material 22, which preferably includes poly silicon or doped poly silicon and collar 24 are deposited such that buried strap 26 forms a connection by outdiffusion of dopants into substrate 20 from poly silicon. Trenches 18 are completely filled with a dielectric material 58 on top of filler material 22. Dielectric material 58 includes for example an oxide (trench top oxide).

Figure 4:
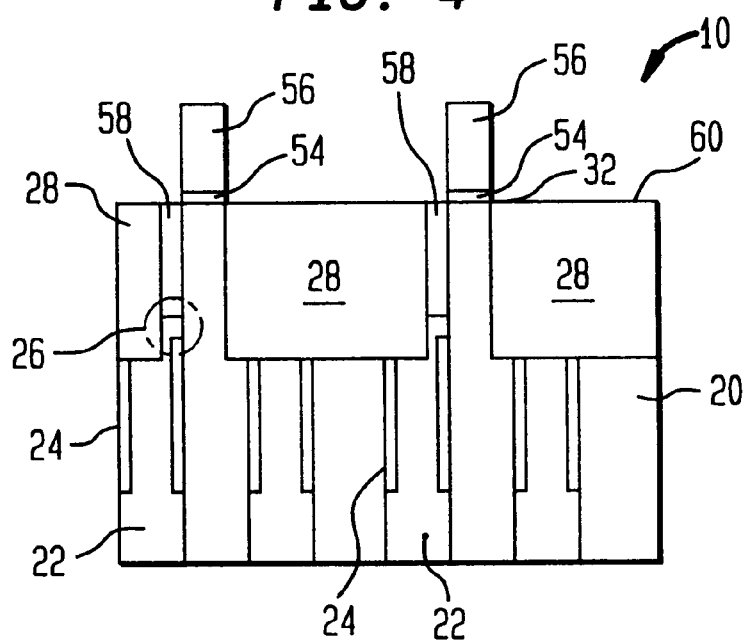
FIG. 4 is a cross-sectional view of the DRAM chip of FIG. 3 showing shallow trench isolation formation in accordance with the present invention.

Referring to FIG. 4, using a lithographic mask, active area 50 is defined (See FIG. 2). A portion of substrate 20, collar 24, filler 22, thermal pad layer 54 and pad layer 56 are removed, for example, by reactive ion etching (RIE) and STI 28 is deposited therein. STI 28 and dielectric material 58 are the same material preferably silicon dioxide. A top surface 60 of STI 28 is brought to about the same level as top surface 32 of substrate 20.

Figure 5:
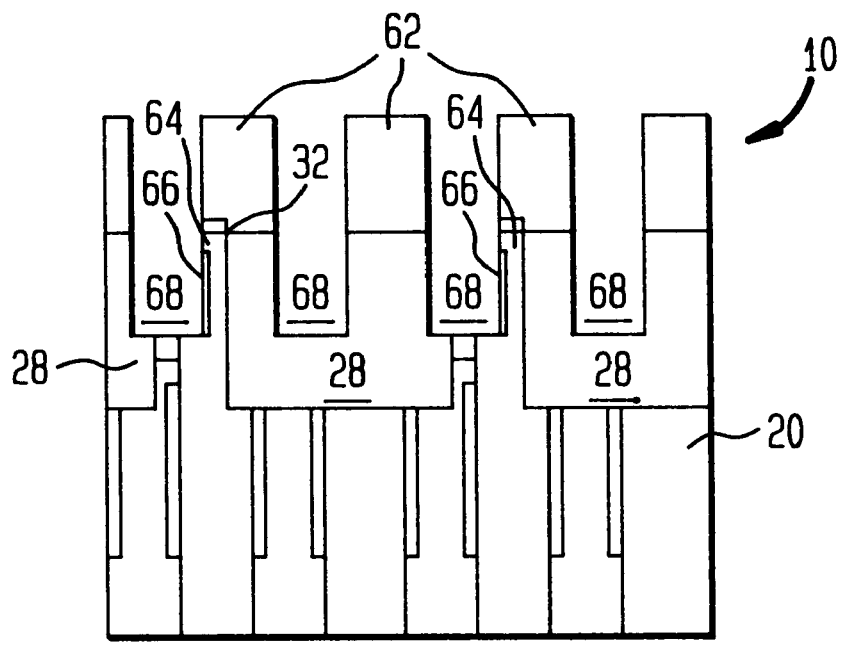
FIG. 5 is a cross-sectional view of the DRAM chip of FIG. 4 showing etched positions for buried wordline formation in accordance with the present invention.

Referring to FIG. 5, after removing pad layer 56, a second pad layer 62 is deposited on DRAM chip 10. Second pad layer 62 is the same material as pad layer 56, preferably silicon nitride which is selectively etchable relative to silicon oxide. Second pad layer 62 is patterned and etched to pattern and etch STI 28 and a portion 64 of substrate 20 to form etched positions 68.

Portion 64 is implanted with boron, phosphorous, arsenic or other suitable semiconductor doping materials. Portion 64 is preferably implanted by an ion implantation process known to those skilled in the art. The characteristics, type of device and a threshold voltage of vertical transistor 12 (FIG. 1) are determined by the type of ions and the dose, and may be adjusted accordingly.

Etched positions 68 adjacent to portion 64 are formed to bury wordline 30 therein. A gate dielectric 66 is formed on portion 64 (a sidewall of portion 64 of substrate 20) which is exposed during the etching. In a preferred embodiment, gate dielectric is a deposited or thermal oxide or nitride or a combination of both.

Figure 6:
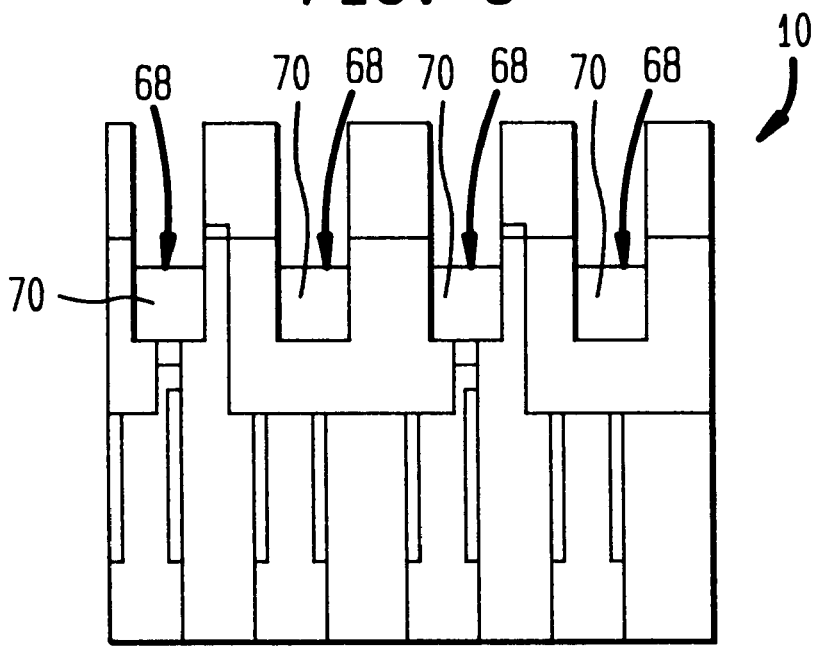
FIG. 6 is a cross-sectional view of the DRAM chip of FIG. 5 showing etched positions filled with a conductive material to form buried wordlines in accordance with the present invention.

Referring to FIG. 6, etched positions 68 are filled with a conductive material 70, for example poly silicon, by, for example, deposition and recessing below surface 32 of substrate 20. The conductive material is deposited to form word lines 30.

Figure 7:
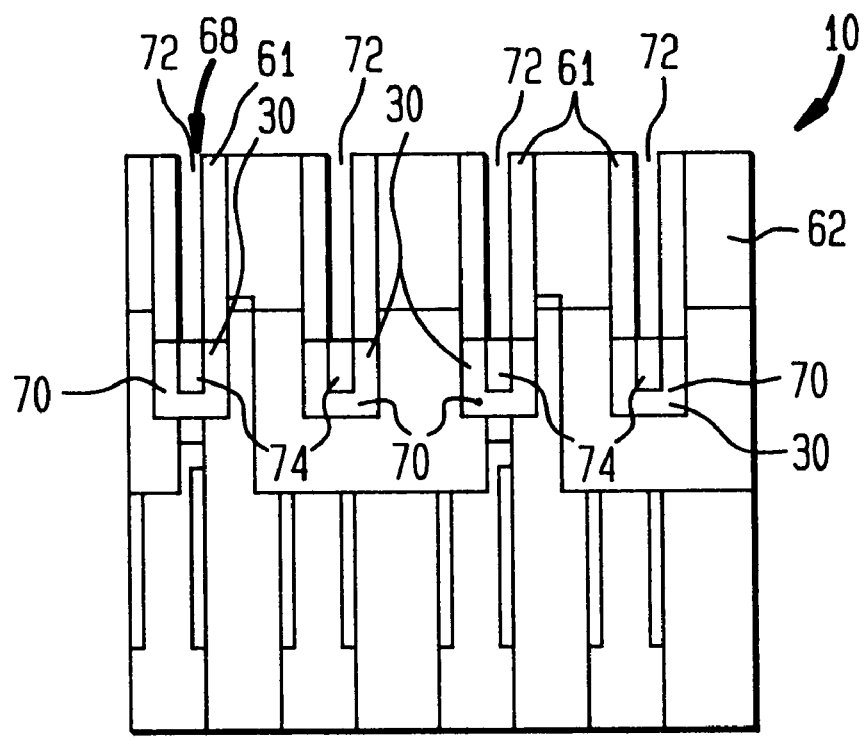
FIG. 7 is a cross-sectional view of the DRAM chip of FIG. 6 showing a conductive material deposited within wordlines in accordance with the present invention.

Referring to FIG. 7, in a preferred embodiment, a recess 72 is formed into conductive material 70 with the aid of spacers 61 preferably formed of oxide or nitride. High conductive material 74 is deposited therein. Material 74 functions to improve performance of wordlines 30 by increasing their conductivity. Material 74 may include a silicide, for example tungsten silicide, a salicide, for example tungsten salicide or other suitable materials. Material 74 is preferably deposited by a deposition and recess process.

Figure 8:
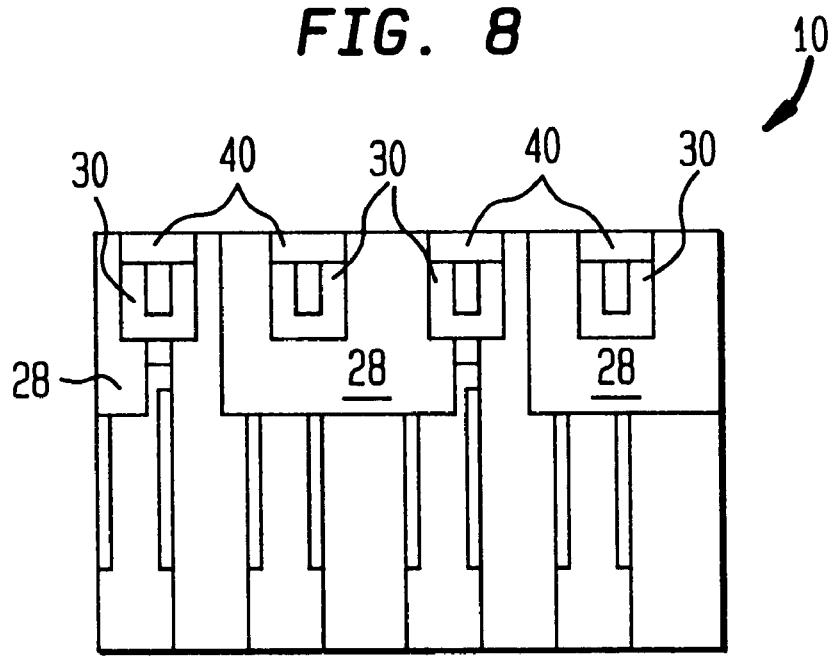
FIG. 8 is a cross-sectional view of the DRAM chip of FIG. 7 showing a dielectric layer deposited to bury wordlines and form a surface for further processing in accordance with the present invention.

Referring to FIG. 8, spacers 61 are removed with pad layer 62. At this point, it is advantageous to perform processing of substrate 20 in its present condition (planar substrate surface exposed). For example, in an embedded DRAM chip planar processing may be performed on the substrate to form logic devices. Deposition of dielectric material and the planarization or deposition and recess, both down to substrate 20 forms layer 40 of the same material as STI 28, preferably an oxide. Dielectric layer 40 buries wordlines 30 (wordline top oxide). Alternately, after dielectric deposition, pad layer 62 and thermal pad layer 54 may be stripped away by a mechanical or chemical process, for example chemical mechanical polishing (CMP), or a combination of both, thereby preparing and opening top surface 32 for contact formation.

Referring again to FIG. 1, dielectric layer 44 is deposited and patterned to receive bitline contact 42 material therein. Bitline contacts 42 are formed within dielectric layer 44. Bitline contacts 42 preferably include tungsten, aluminum or other suitable contact materials. Bitline contacts 42 couple to vertical transistor 12 at contact area 46. In one embodiment, contact area 46 may include an additional material to increase conductivity, for example, contact area 46 may include a silicide or salicide, with for example, tungsten, cobalt, titanium. Bitline contacts 42 electrically connect bitlines 48 to vertical transistor 12. Since vertical transistor 12 is formed separately from trenches 18, overloading of the processing inside of trenches 18 is avoided. Many consecutive recessing steps provided in conventional processing are avoided in accordance with the present invention.

Figure 9:
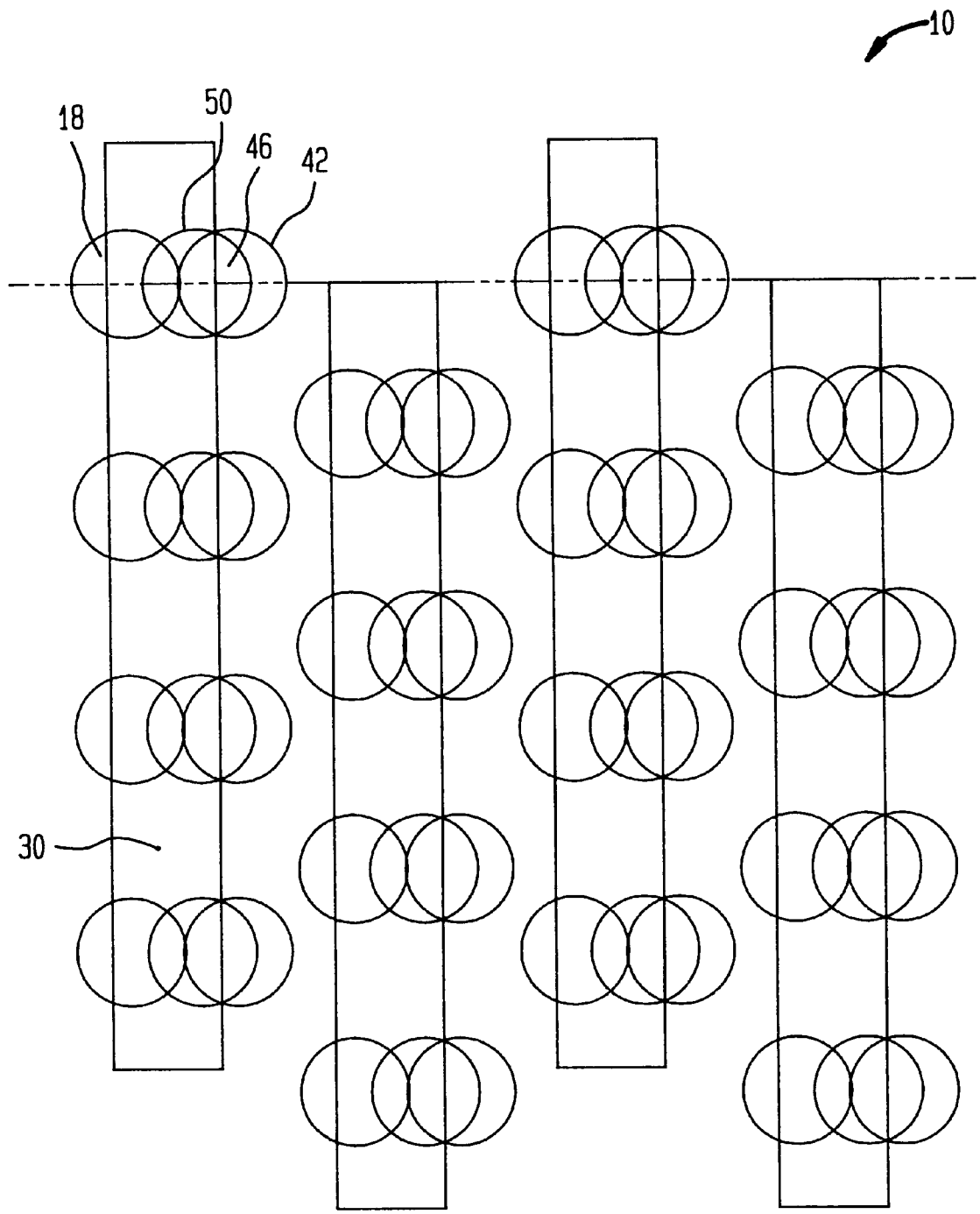
FIG. 9 is a plan view of the DRAM chip of FIG. 2 showing contact areas having an additional conductive material layer deposited to enhance performance in accordance with the present invention.
Figure 10A:
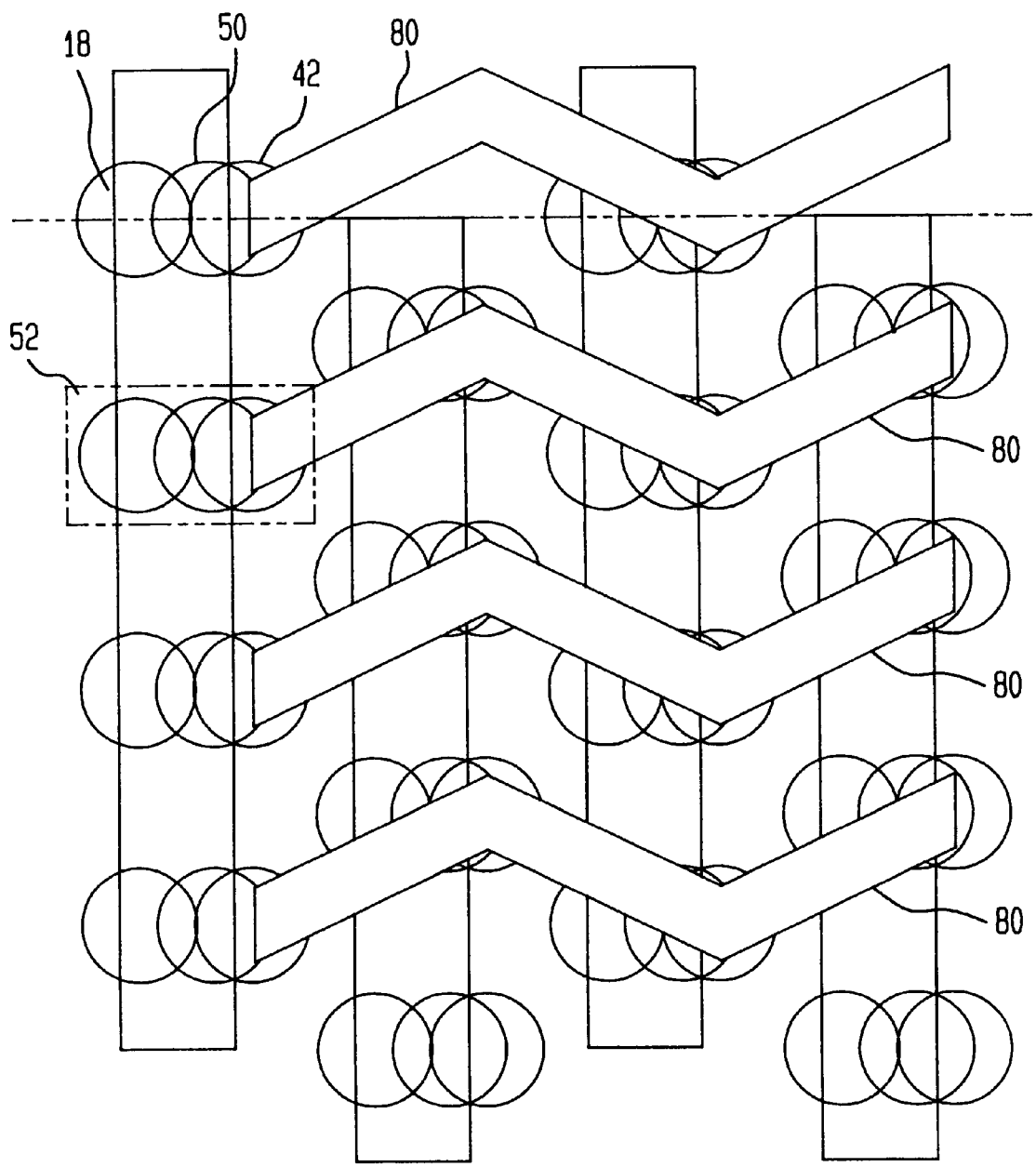
FIG. 10A is a plan view of a DRAM showing a hexagonal pattern of memory cells with bitlines arranged in a "zig-zag" pattern in accordance with the present invention.
Figure 10B:
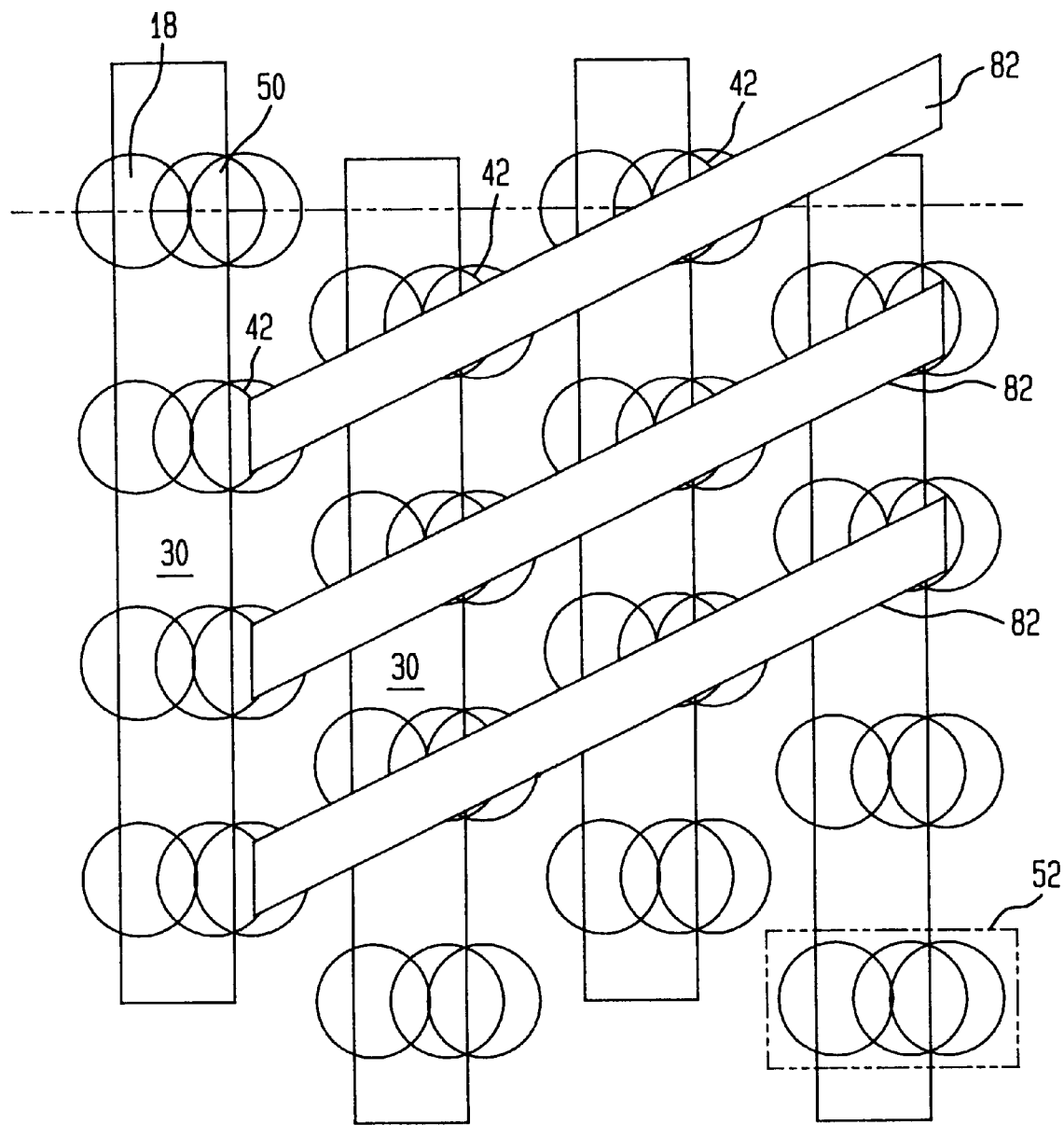
FIG. 10B is a plan view of a DRAM showing a hexagonal pattern of memory cells with bitlines arranged in a diagonal pattern in accordance with the present invention.
Figure 10C:
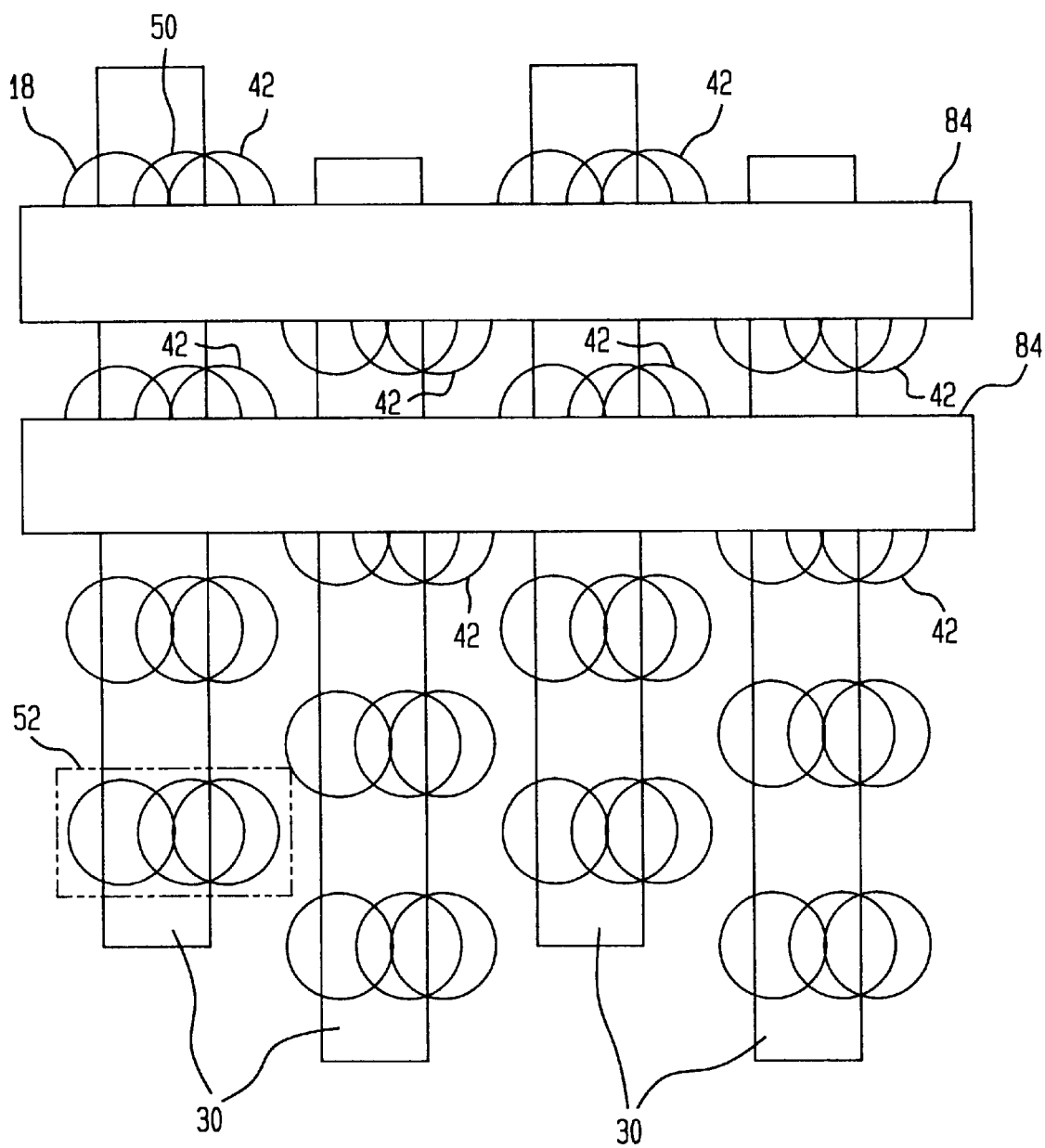
FIG. 10C is a plan view of a DRAM showing a hexagonal pattern of memory cells with bitlines arranged in a substantially perpendicular to wordlines in accordance with the present invention.

As shown in FIG. 9, a plan view of DRAM 10 shows contact area 46 relative to trench 18, active area 50, wordline 30 and bitline contact 42. Referring to FIGS. 10A–C, bitline configurations are shown for DRAM chip 10 in accordance with the present invention. As shown in FIG. 10A, bitlines 80 are shown connecting with bitline contacts 42 for memory cells 52. Due to the hexagonal pattern of memory cells 52, bitlines 80 are oriented in a "zig-zag" pattern. As shown in FIG. 10B, bit lines 82 are shown connecting with bitline contacts 42 for memory cells 52. Bitlines 82 extend diagonally across DRAM chip 10. Bitlines 82 remain transverse to wordlines 30, but are not necessarily orthogonal to wordlines 30. As shown in FIG. 10C, bit lines 84 are shown connecting with bitline contacts 42 for memory cells 52. Bitlines 84 extend orthogonally across DRAM chip 10 relative to wordlines 30. Bitline contacts 42 in adjacent rows (or columns) connect to the same bitline 84.

Referring to FIG. 11, another embodiment of the present invention includes a DRAM chip 100 having buried wordlines 130 wherein vertical transistors 112 have buried straps 126 within trenches 118 which are oriented parallel to wordlines 130. FIG. 11 shows a cross-section, taken at section line 1111 of FIG. 12, of a portion of a DRAM chip 100 in accordance with the present invention. DRAM chip 100 includes vertical transistors 112 for accessing a storage nodes 114 of trench capacitors 116. Storage nodes 114 are formed by etching trenches 118 into a substrate 120. Substrate 120 is typically made from silicon, however other suitable materials may be used. Trenches 118 are filled with a filler material 122, preferably polysilicon. Trenches 118 also have a collar 124 and a thin dielectric 119 formed therein and extending around interior walls of trenches 118. Collar 124 is formed from dielectric material, preferable an oxide, for example silicon dioxide. Thin dielectric 119 and collar 124 prevent charge leakage into substrate 120 from storage node 114.

Buried strap 126 electrically couples storage node 114 to vertical transistor 112. As shown in FIG. 11, buried strap 126 extends in a parallel direction relative to wordlines 130. Buried strap 126 preferably includes polysilicon or doped polysilicon. Buried strap includes an outdiffusion region 108 (dopants out diffuse to form a better connection) which extends to a transistor channel which is along the sidewall of wordline 130. Shallow trench isolation 128 (STI) electrically isolates storage node 114 and buried strap 126 from active areas, other devices and metal lines. STI 128 includes a dielectric material, preferably an oxide, such as silicon dioxide. Wordlines 130 extend through DRAM chip 100. Word lines 130 are shown buried below a top surface 132 of substrate 120. Wordlines 130 function as a gate conductor (GC) for vertical transistors 112. Wordlines 130 are adjacent to substrate 120 on a sidewall 134 (see FIG. 14).

Bitline contacts 142 are formed within a dielectric layer 144. Bitline contacts 142 preferably include tungsten, aluminum or other suitable contact metals. Bitline contacts 142 couple to vertical transistor 112 at a contact area 146 (See FIG. 13). In one embodiment, contact area 146 may include an additional material to increase conductivity, for example contact are may include a silicide or salicide (for example titanium, cobalt or tungsten). Bitline contacts 142 electrically connect bitlines 148 to vertical transistor 112. In one embodiment, bitline contacts 142 are formed simultaneously with support contacts as described above.

Vertical transistor 112 conducts when enabled by wordline 130. Bitline 142 acts as a source (or drain) and storage node 114 acts as a drain (or source). When charge is to be stored in storage node 114, for example in a write operation, storage node 114 is brought to a lower potential by a power supply (not shown). Wordline 130 and bitline 148 are activated and vertical transistor 112 conducts between bitline 148 and storage node 114 (through buried strap 126) to charge storage node 114. Buried strap 126 is parallel relative to wordline 130 and includes an outdiffusion region in which dopants outdiffuse. Details on doping and formation of vertical transistor 112 in accordance with the present invention are described herein.

Figure 12:
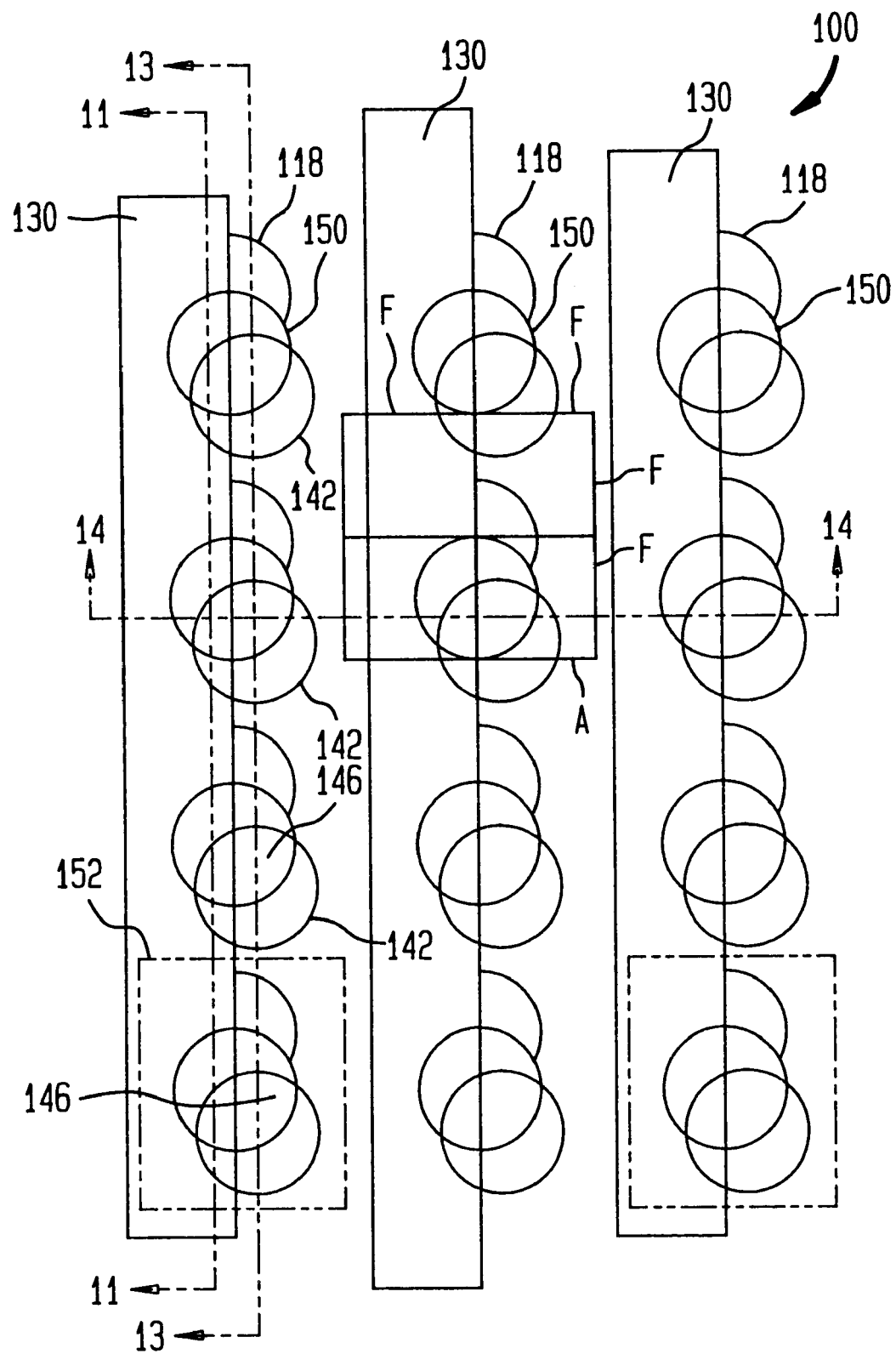
FIG. 12 is a plan view of the DRAM chip of FIG. 11 with components shown having substantially the same shape and shifted along wordlines in accordance with the present invention.

Referring to FIG. 12, a plan view of DRAM chip 100 is shown. Trenches 118, active areas 150 for vertical transistors 112 (FIG. 11) and bitline contacts 142 are shown for a plurality of memory cells 152. Wordlines 130 are also indicated. The shapes of trenches 118, active areas 150 and bitline contacts 142 are again approximately the same. In this way, a cell area of about $4F^2$ or below is achievable where F is a minimum feature size (as shown in box "A"). Larger cell areas are contemplated as well. Trenches 118, active areas 150 and contacts 142 are shifted along wordlines 130. The shapes of trenches 118, active areas 150 and bitline contacts 142 being approximately the same permits same lithographic shapes for processing DRAM chip 100 and therefore simplifies processing and reduces costs. In a preferred embodiment, the same lithographic mask is used for formation of trenches 118, active areas 150 and bitline contacts 142.

As shown in FIG. 12, each memory cell includes its own active area 150 forming an open bitline architecture. This architecture provides isolation from neighboring memory cell active areas and thereby reduces any impact therefrom. Other architectures take advantage of vertical transistors one such architecture is described below with reference to FIG. 22.

Figure 13:
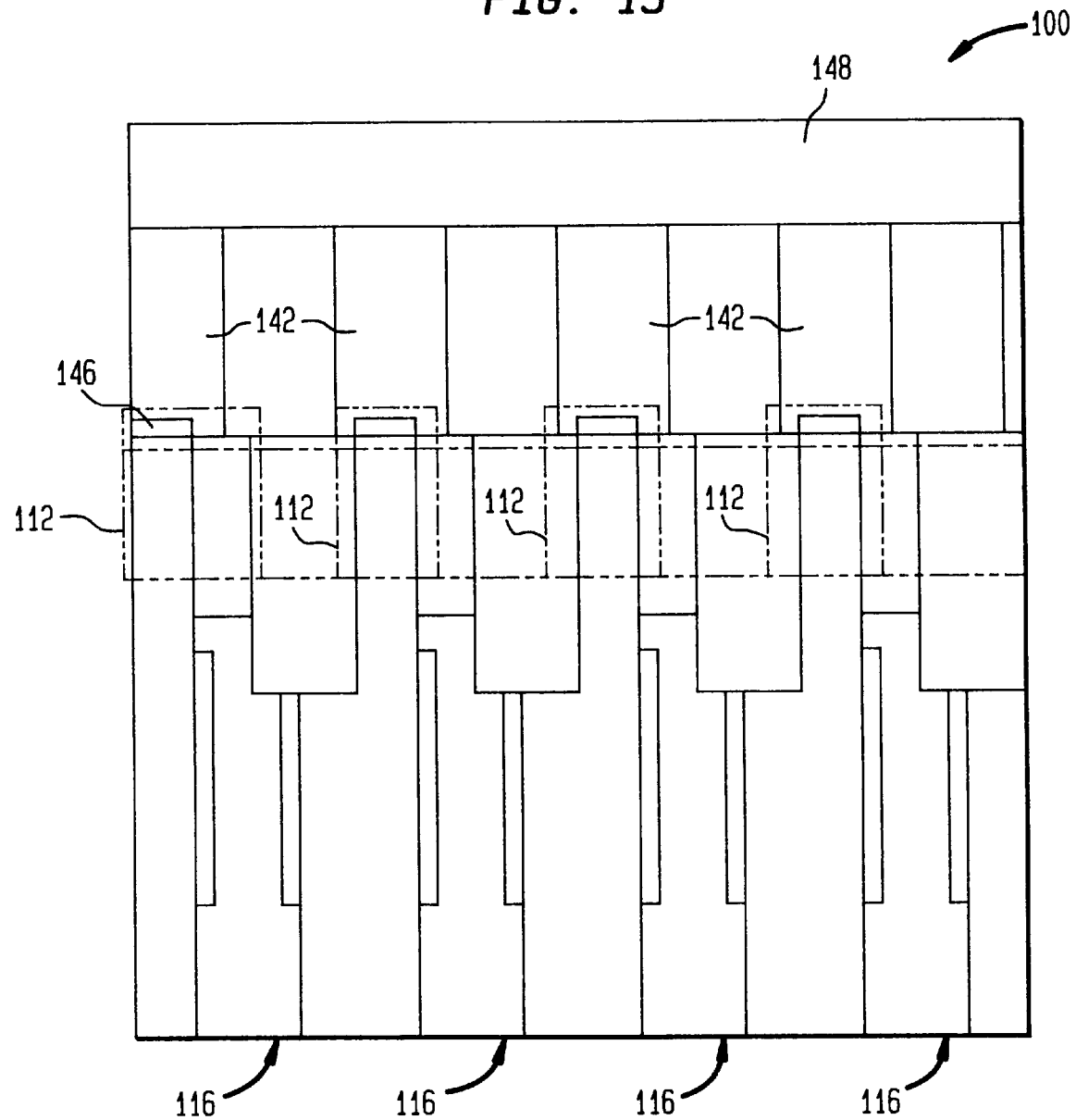
FIG. 13 is a cross-sectional view taken along section line 13—13 of FIG. 12 showing the DRAM chip having vertical transistors with a buried strap disposed substantially parallel to wordlines in accordance with the present invention.

Referring to FIG. 13, a cross-sectional view taken along section line 13—13 of FIG. 12 is shown for DRAM chip 100. Section line 13—13 is outside of wordline 130 to show vertical transistors 112 in more detail.

Figure 14:
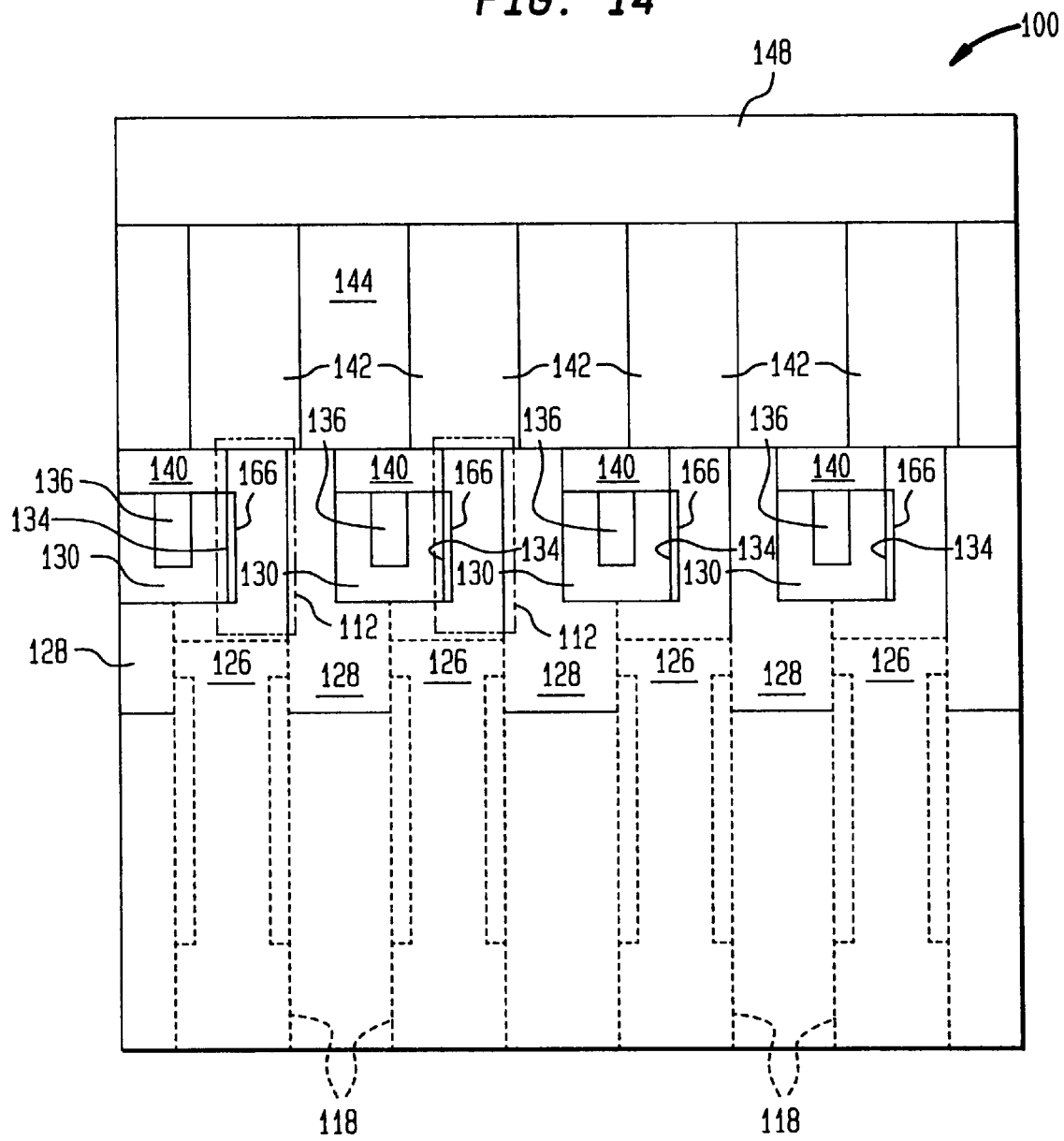
FIG. 14 is a cross-sectional view taken along section line 14—14 of FIG. 12 showing the DRAM chip having vertical transistors with a buried strap disposed substantially parallel to wordlines in accordance with the present invention.

Referring to FIG. 14, a cross-sectional view taken along section line 14—14 of FIG. 12 is shown for DRAM chip 100. FIG. 14 shows wordlines 130 transversely sectioned to illustratively demonstrate the difference in orientation as compared to the embodiment shown in FIG. 1. Buried strap 126 is shown in phantom to further illustrate its orientation in accordance with the present embodiment of the invention. A device channel exists adjacent to a sidewall of wordline 130. Wordlines 130 preferably include a more conductive center portion 136. In one embodiment, center portion 136 includes a metal silicide, for example tungsten silicide, or a salicide, for example tungsten salicide. Wordlines 130 are enclosed by a dielectric layer 140 which is preferably the same dielectric material as STI 128. A gate dielectric 166 is shown adjacent to sidewall 134 of wordlines 130. Wordline 130 functions as a gate conductor for activating vertical transistor 112.

Figure 15:
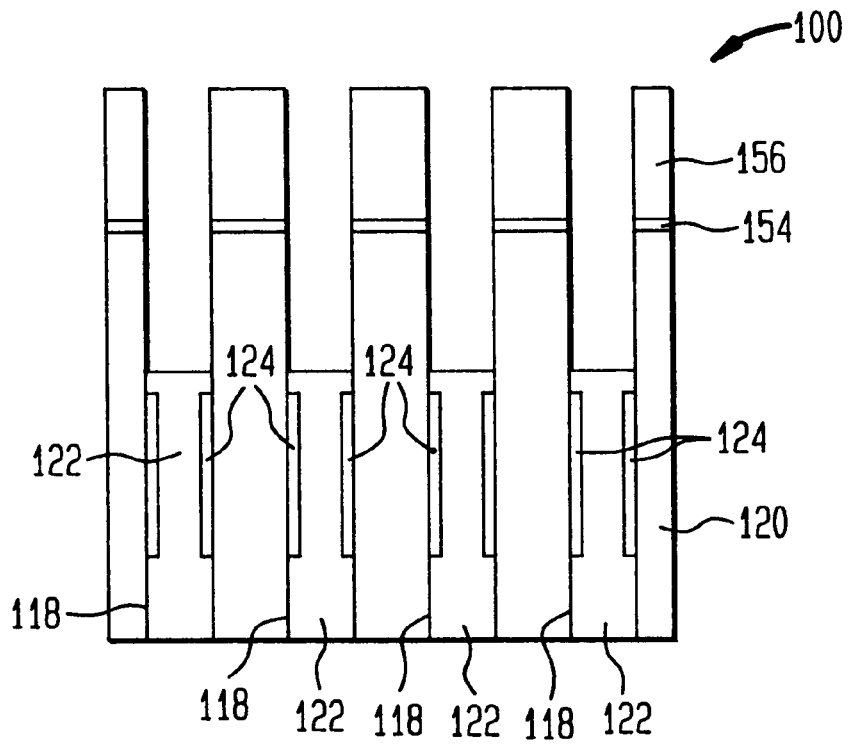
FIG. 15 is a cross-sectional view of the alternate embodiment of the DRAM chip of FIG. 12 showing trenches formed and filled in accordance with the present invention.

Referring to FIG. 15, a structure is shown having trenches 118 etched, collars 124 and thin dielectric layer 119 formed and filler material 122 deposited within substrate 120. Buried strap 126 outdiffusion region 127 is shown. A thermal pad layer 154 and a pad layer 156 are formed on substrate 120 prior to trench 118 etching. Thermal pad layer 154 is preferably silicon dioxide formed by exposing silicon substrate 120 to oxygen at elevated temperatures. Pad layer 156 preferably includes silicon nitride. Pad layer 156 functions, among other things, as a mask to selectively etch trenches 118 in substrate 120 as is known to those skilled in the art.

Figure 16:
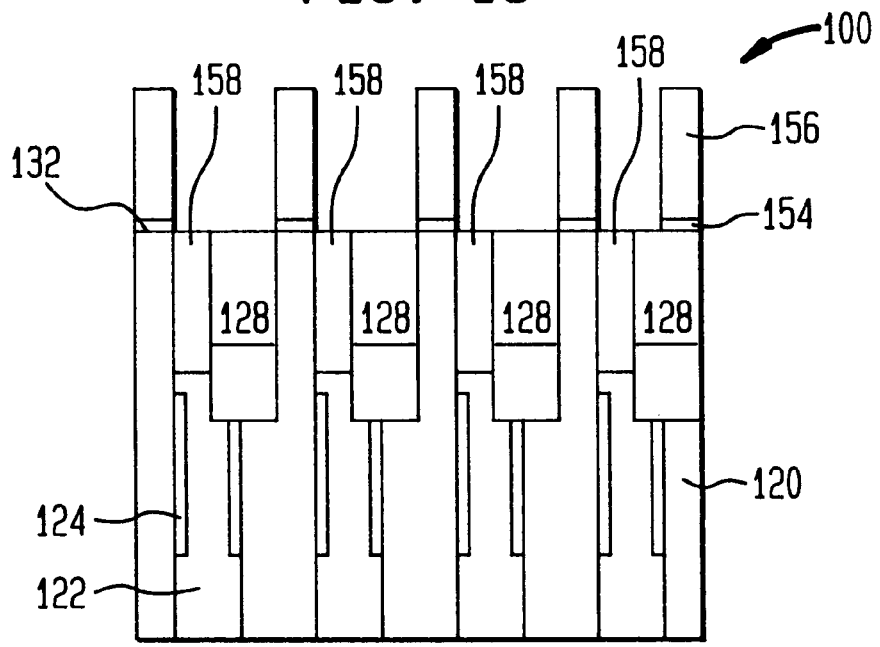
FIG. 16 is a cross-sectional view of the DRAM chip of FIG. 15 showing shallow trench isolation formation in accordance with the present invention.

Referring to FIG. 16, top portions of trenches 118 are completely filled with a dielectric material 158, for example an oxide (trench top oxide). Using an active area mask, a portion of substrate 120, collar 124, filler 122, thermal pad layer 154 and pad layer 156 are removed and STI 128 is deposited therein. STI 128 and dielectric material 158 are preferably the same material, e.g. silicon dioxide. A top surface 160 of STI 128 is brought to about the same level as top surface 132 of substrate 120.

Figure 17:
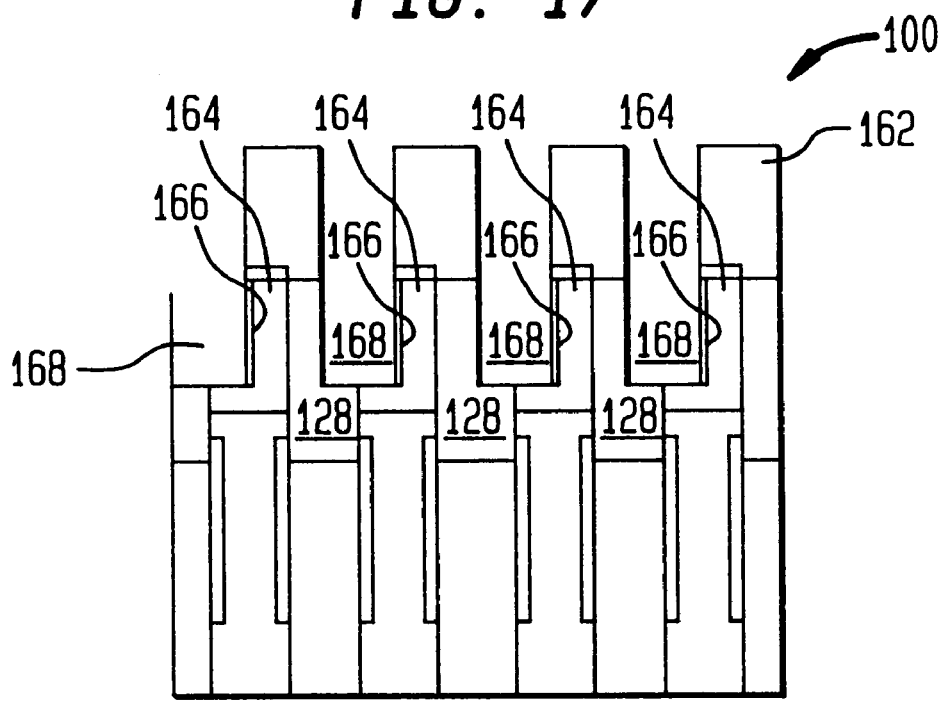
FIG. 17 is a cross-sectional view of the DRAM chip of FIG. 16 showing etched positions for buried wordline formation in accordance with the present invention.

Referring to FIG. 17, after removing pad layer 156, a second pad layer 162 may be deposited on DRAM chip 100 to optimize following wordline formation. Second pad layer 162 is the same material as pad layer 156, preferably silicon nitride which is selectively etchable relative to silicon oxide. Second pad layer 162 is patterned and etched to pattern and etch STI 128 and a portion 164 of substrate 120 to form etched positions 168.

Portion 164 is implanted with boron, phosphorous, arsenic or other suitable semiconductor doping materials. Portion 164 is preferably implanted by an ion implantation process known to those skilled in the art. A threshold voltage and the type of the vertical transistor 112 (FIG. 11) is determined by the type of ions and the dose.

Etched positions 168 adjacent to portion 164 are formed to bury wordline 130 therein. Gate dielectric 166 is formed on portion 164 which is exposed during the etching. In a preferred embodiment, gate dielectric 166 is a deposited silicon oxide material or a thermal oxide or nitride or combination thereof.

Figure 18:
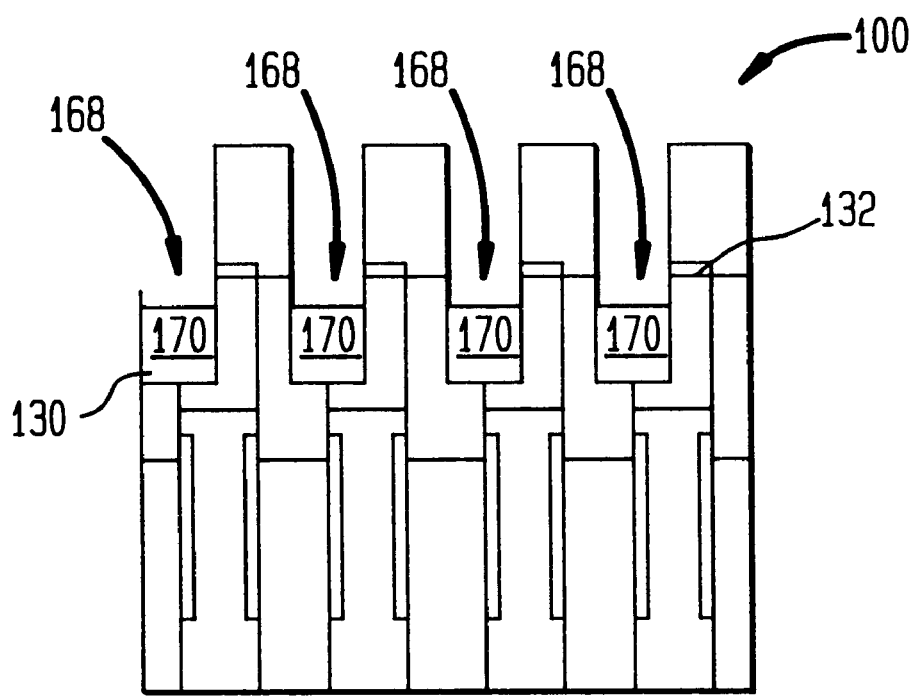
FIG. 18 is a cross-sectional view of the DRAM chip of FIG. 17 showing etched positions filled with a conductive material to form buried wordlines in accordance with the present invention.

Referring to FIG. 18, etched positions 168 are filled and recessed below surface 132 with a conductive material 170, for example polysilicon. The conductive material is deposited to form word lines 130.

Figure 19:
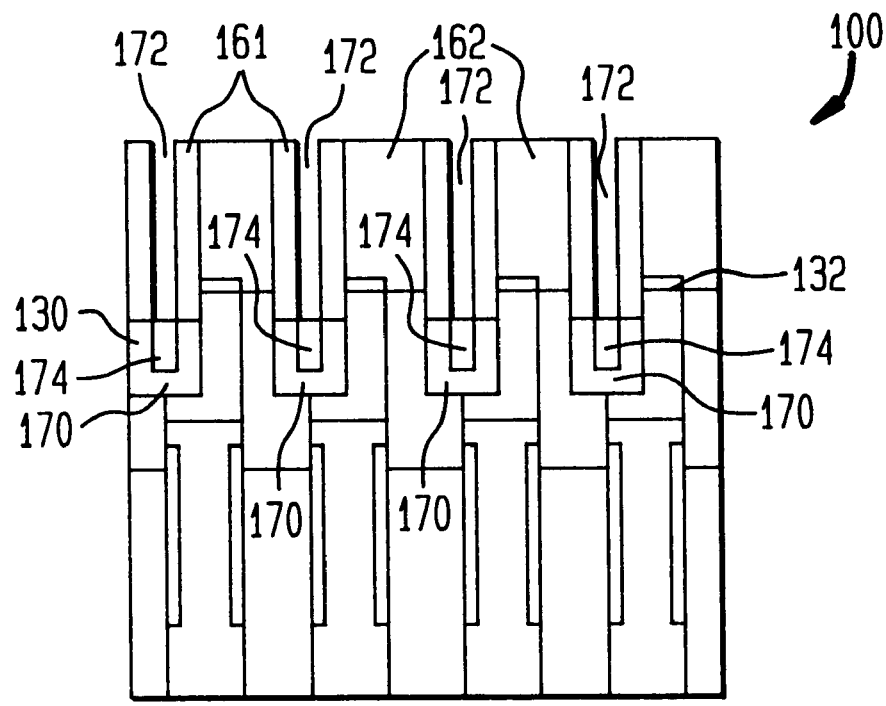
FIG. 19 is a cross-sectional view of the DRAM chip of FIG. 18 showing a high conductive material deposited within wordlines in accordance with the present invention.

Referring to FIG. 19, in a preferred embodiment, a recess 172 is formed in conductive material 170 with the aid of spacers 161, preferably formed of oxide or nitride. A high conductive material 174 is deposited in recess 172. Material 174 functions to improve performance of wordlines 130 by increasing their conductivity. Material 174 may include a silicide (deposited by, for example a deposit and recess process), for example tungsten silicide, a salicide, for example tungsten salicide or other suitable materials.

Figure 20:
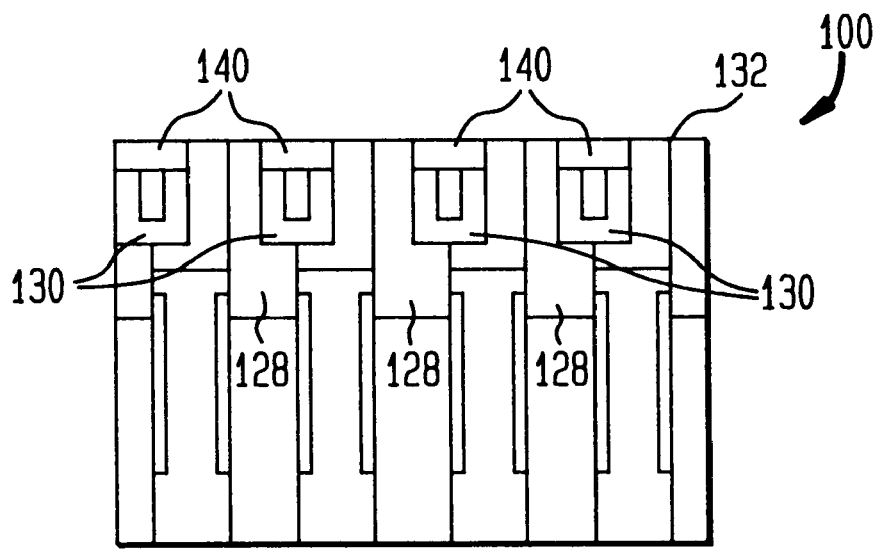
FIG. 20 is a cross-sectional view of the DRAM chip of FIG. 19 showing a dielectric layer deposited to bury wordlines and form a surface for further processing in accordance with the present invention.

Referring to FIG. 20, spacers 161 are removed with pad layer 162. Deposition of dielectric material and the planarization or deposition and recess, both down to surface 132, forms layer 140 of the same material as STI 128, preferably an oxide. Dielectric layer 140 buries wordline 130. Alternately, pad layer 162 and thermal pad layer 154 are stripped away by a mechanical or chemical process, for example chemical mechanical polishing (CMP) thereby preparing top surface 132 for contact formation.

Referring again to FIG. 14, dielectric layer 144 is deposited and patterned to receive bitline contact 142 material therein. Bitline contacts 142 are formed within dielectric layer 144. Bitline contacts 142 preferably include tungsten, aluminum or suitable contact materials. Bitline contacts 142 couple to vertical transistor 112 at a contact area as described in FIG. 1 above. Bitline contacts 142 electrically connect bitlines 148 to vertical transistor 112. Since vertical transistor 112 is formed separately from trenches 118, overloading of process steps inside of trenches 118 is avoided, e.g. the trenches are not over processed.

Figure 21A:
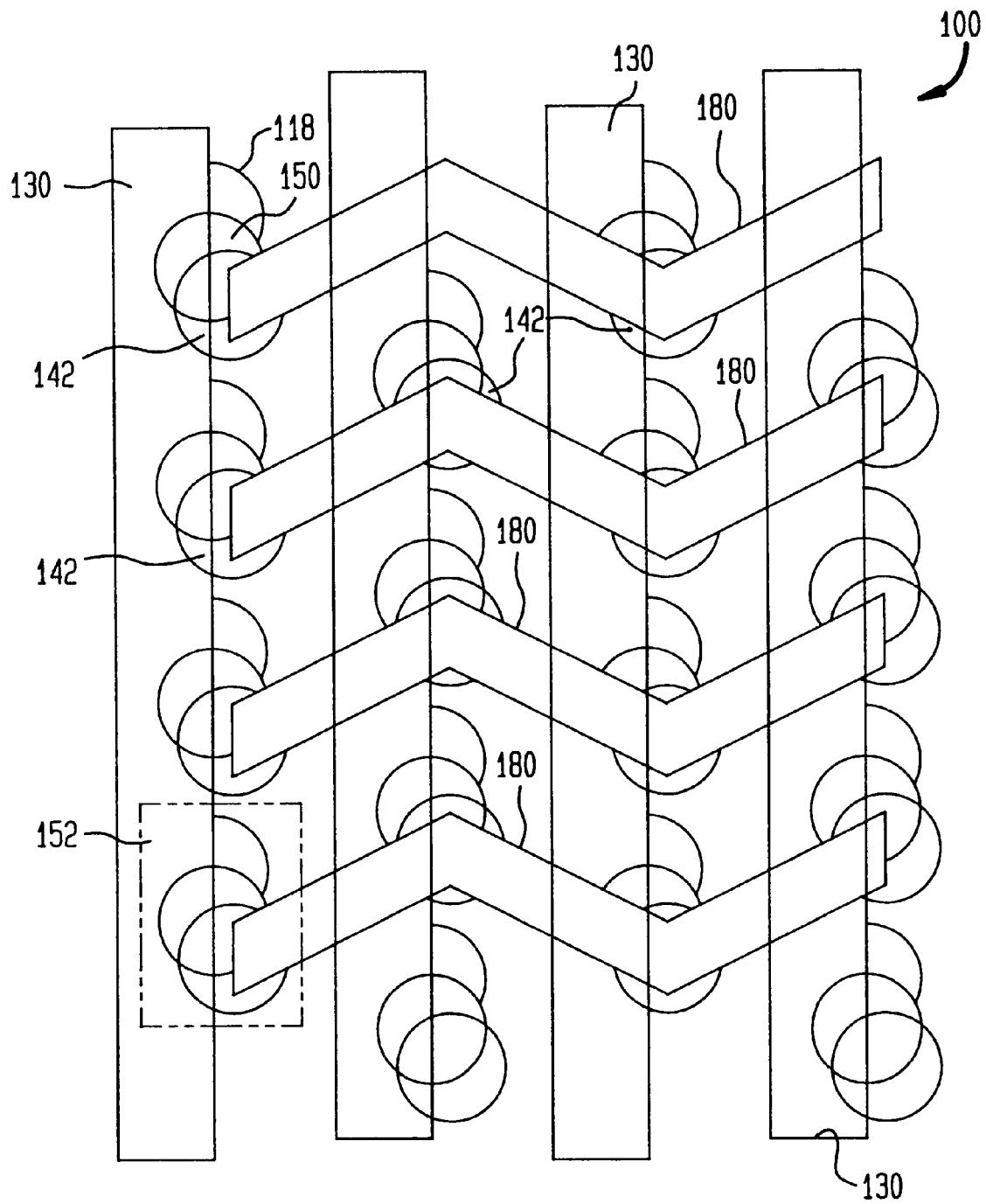
FIG. 21A is a plan view of an alternate embodiment of the DRAM showing a hexagonal pattern of memory cells with bitlines arranged in a "zig-zag" pat tern in accordance with the present invention.
Figure 21B:
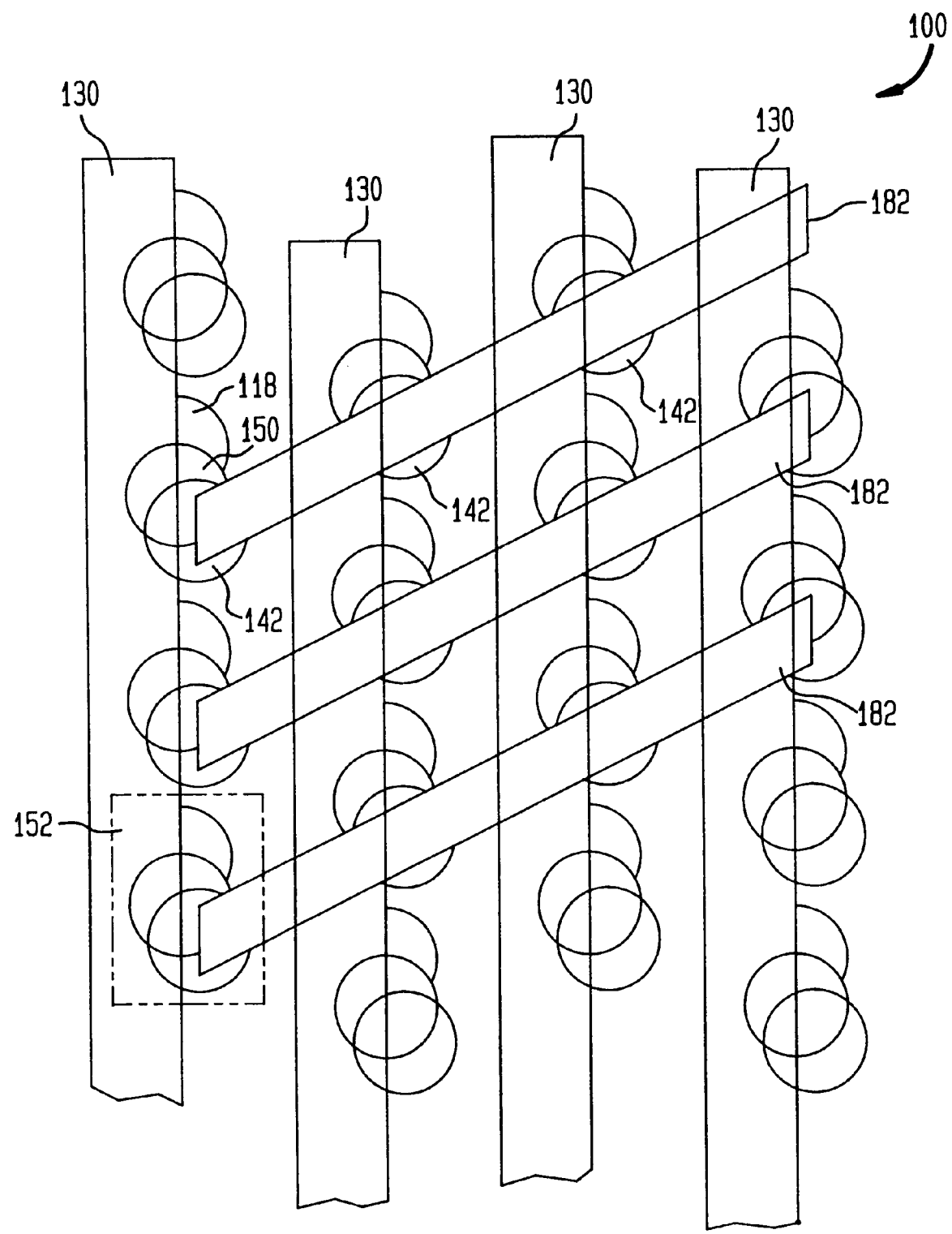
FIG. 21B is a plan view of an alternate embodiment of the DRAM showing a hexagonal pattern of memory cells with bitlines arranged in a diagonal pattern in accordance with the present invention.
Figure 21C:
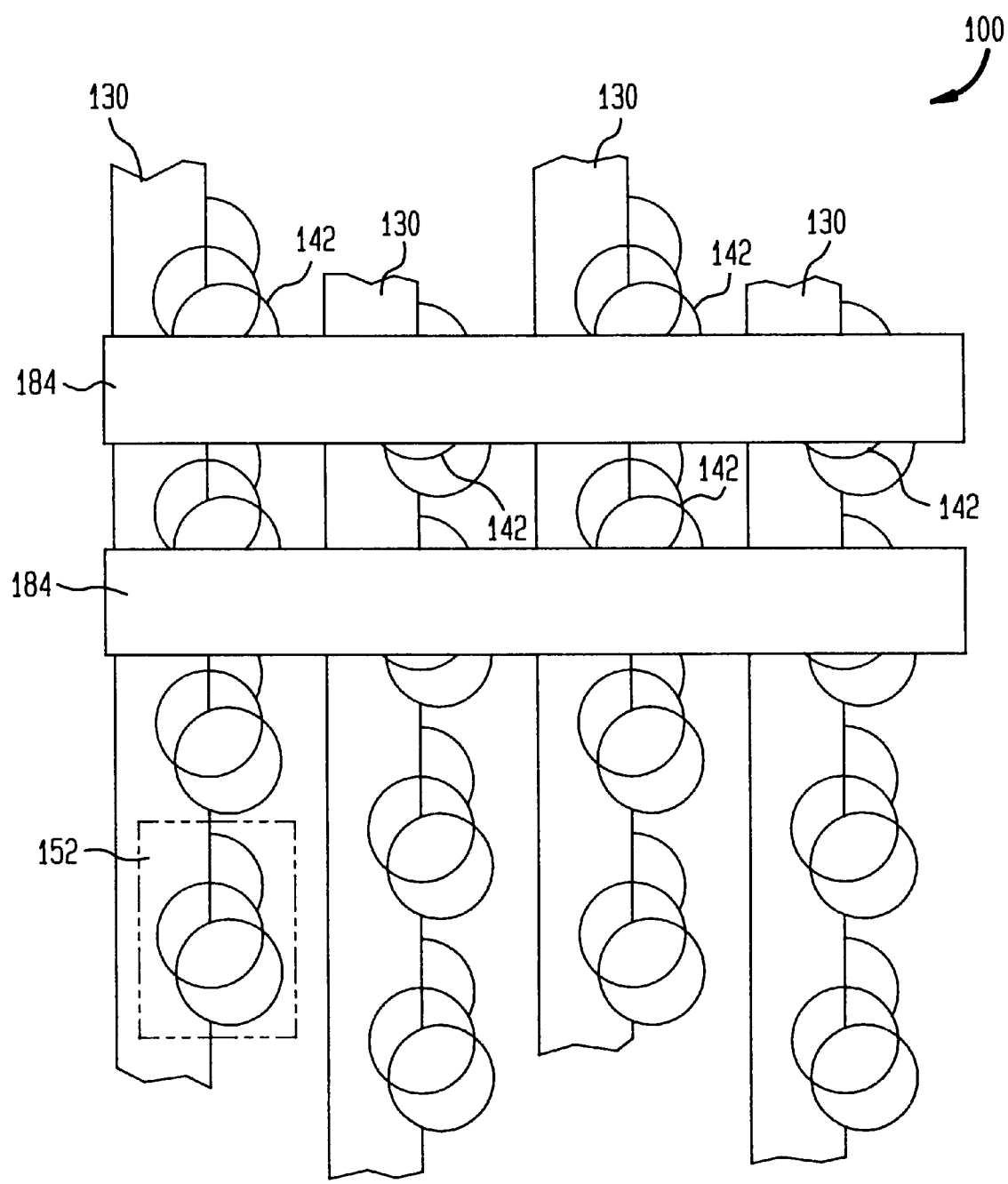
FIG. 21C is a plan view of an alternate embodiment of the DRAM showing a hexagonal pattern of memory cells with bitlines arranged in a substantially perpendicular to wordlines in accordance with the present invention.

Referring to FIGS. 21A–C, bitline configurations are shown for DRAM chip 100 in accordance with the present invention. As shown in FIG. 21A, bitlines 180 are shown connecting with bitline contacts 142 for memory cells 152. Memory cells 152 are arranged in a hexagonal pattern to increase cell density on DRAM chip 100. Due to the hexagonal pattern of memory cells 152, bitlines 180 are oriented in a "zig-zag" pattern. As shown in FIG. 21B, bit lines 182 are shown connecting with bitline contacts 142 for memory cells 152. Bitlines 182 extend diagonally across DRAM chip 100. Bitlines 182 remain transverse to wordlines 130, but are not necessarily orthogonal to wordlines 130. As shown in FIG. 21C, bit lines 184 are shown connecting with bitline contacts 142 for memory cells 152. Bitlines 184 extend orthogonally across DRAM chip 100 relative to wordlines 130.

Figure 22:
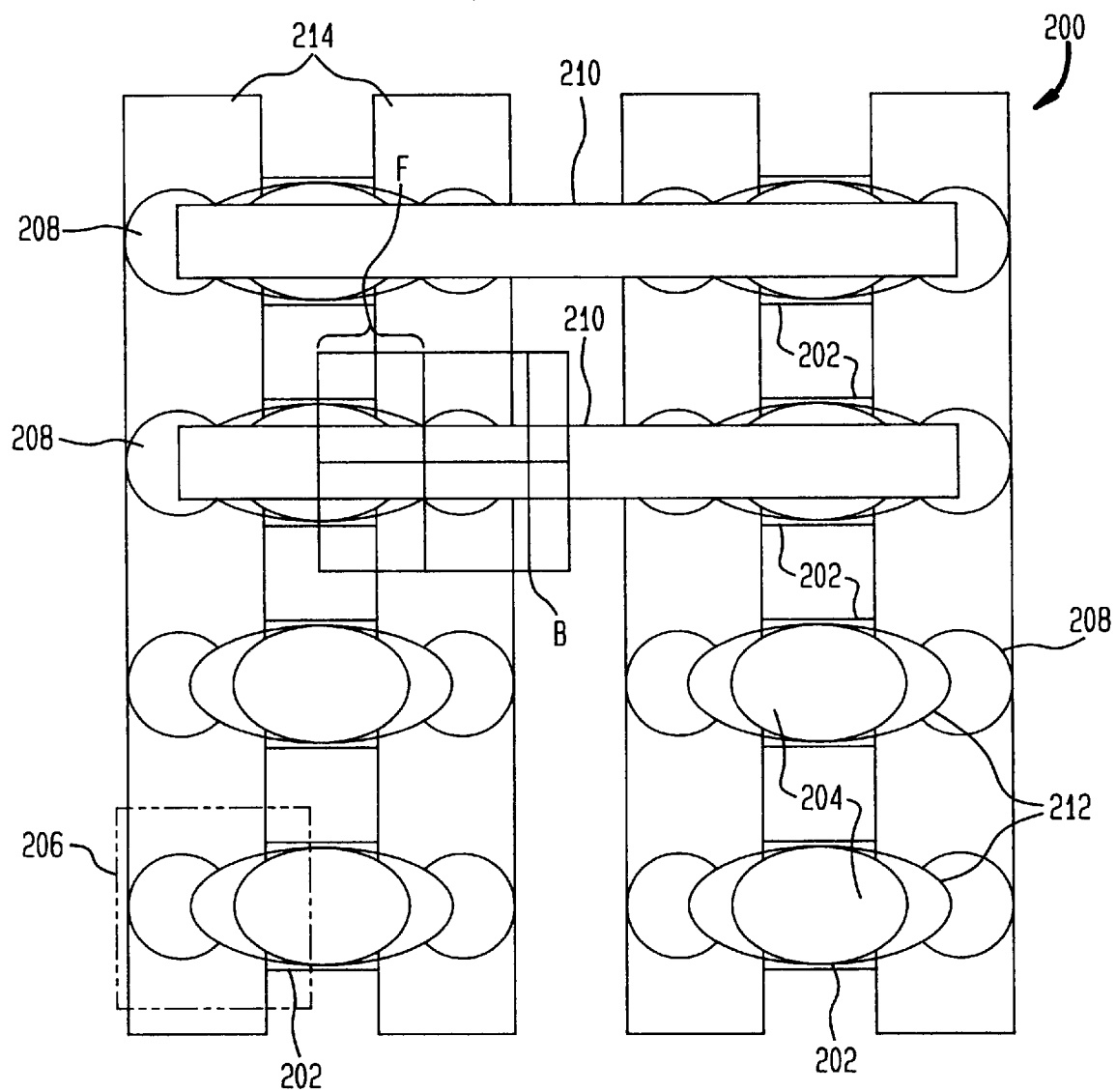
FIG. 22 is a plan view of an alternate embodiment of the DRAM in accordance with the present invention showing vertical transistors sharing active areas and bitline contacts.
Figure 23:
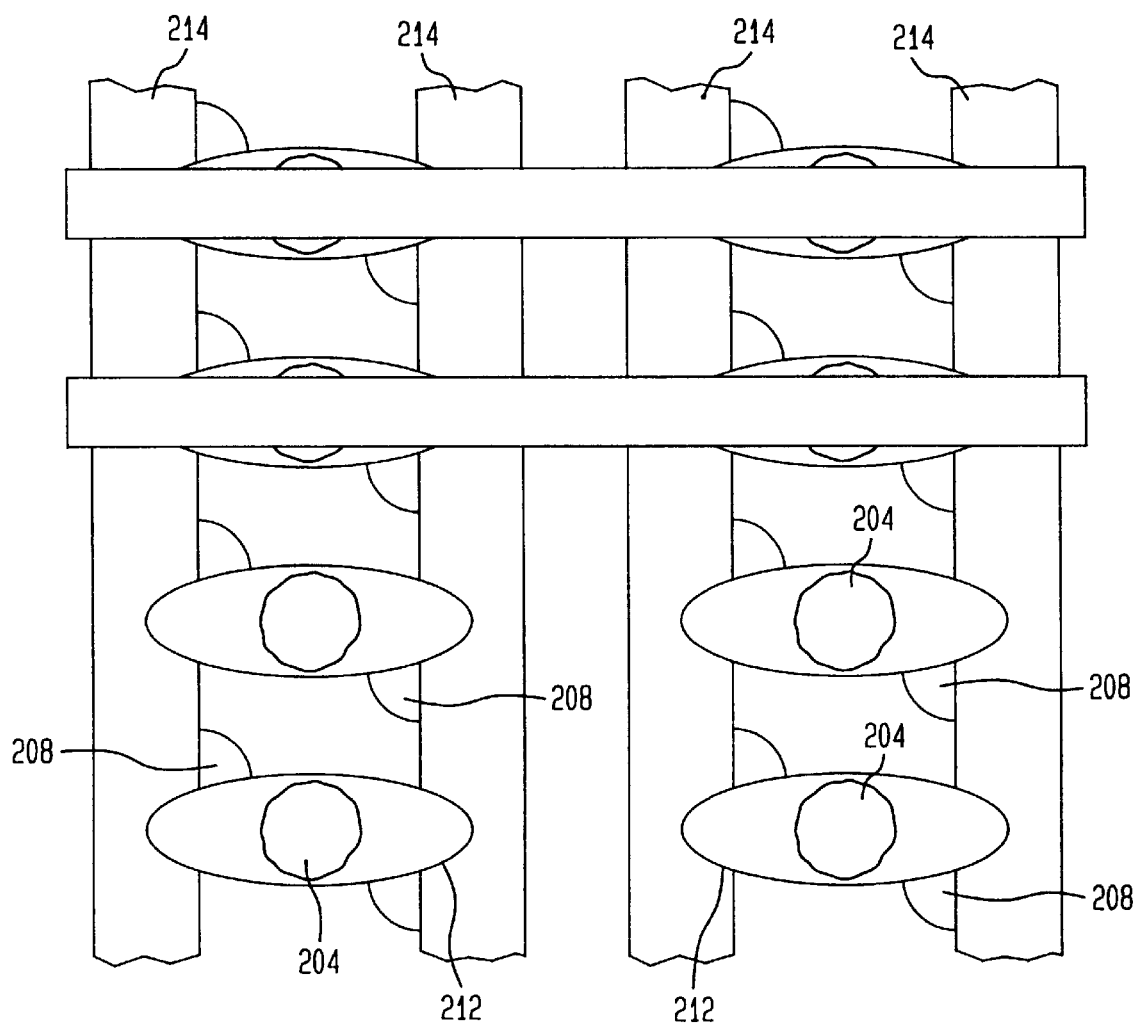
FIG. 23 is a plan view of an alternate embodiment of the DRAM in accordance with the present invention showing vertical transistors sharing active areas and bitline contacts.

Referring to FIG. 22, a DRAM chip 200 is shown with vertical device 12 having buried strap 26 perpendicular to wordline 30 (See FIG. 1). Available contact areas 202 and bitline contacts 204 are shared between memory cells 206. Contact areas 202 are directly below contacts 204. Memory cells 206 include trenches 208 and vertical transistors in accordance with the present invention. Bitlines 210 are configured to pass directly over contacts 204 and are substantially perpendicular to wordlines 214. Active areas 212 are also shown and shared between adjacent vertical devices. Memory cells 206 using the configuration shown in FIG. 22 may have a cell area of about $4^{2/3}$ $F^2$ as shown by box "B", where F is the minimum feature size of the chip. FIG. 22 shows a configuration where buried straps 26 are perpendicular to wordlines 214, however, a similar configuration is possible, as shown in FIG. 23, for vertical devices having buried straps 126 parallel to wordlines 214. The only difference being trenches 208 are displaced along wordlines 214.

Having described preferred embodiments for a vertical device and method for semiconductor chips (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor device comprising:

a substrate forming a trench, the trench including a storage node disposed within the trench;

a wordline disposed completely below a surface of the substrate and adjacent to a portion of the substrate;

a vertically disposed transistor disposed along the portion of the substrate wherein the wordline functions as a gate for the vertically disposed transistor, the storage node and a bitline function as one of a source and a drain such that when activated by the wordline the transistor conducts between the storage node and the bitline; and the vertically disposed transistor being formed in an active area occupying a first layout area, the trench occupying a second layout area and the first layout area including a first characteristic dimension and the second layout area having a second characteristic dimension wherein the first and second characteristic dimensions are parallel and equal.

2. The semiconductor device as recited in claim 1, further comprising a contact for electrically connecting the bitline to the transistor.

3. The semiconductor device as recited in claim 2, wherein the contact electrically connects to the transistor at a contact area and the contact area includes one of a silicide and a salicide.

4. The semiconductor device as recited in claim 1, further comprising a buried strap for accessing the storage node by the transistor wherein the buried strap is oriented substantially perpendicular to a longitudinal of the wordline.

5. The semiconductor device as recited in claim 1, further comprising a buried strap for accessing the storage node by the transistor wherein the buried strap is oriented substantially parallel to a longitudinal length of the wordline.

6. The semiconductor device as recited in claim 1, wherein the wordline further comprises a center region with increased conductivity relative to a conductive outer region of the wordline.

7. The semiconductor device as recited in claim 1, further comprising an active area adjacent to the wordline forming a channel for conducting between the bitline and the storage node.

8. The semiconductor device as recited in claim 7, wherein the active area is utilized by at least one transistor.

9. A memory cell array for a DRAM chip, each memory cell comprising:

a vertically disposed transistor having an active area forming a channel for accessing a storage node, the storage node being disposed within a trench of each memory cell;

a contact couples the transistor to a bitline, wherein the trench, the active area and the contact include characteristic dimensions which are parallel and equal and have same shapes for improving processing of the DRAM chip.

10. The memory cell array as recited in claim 9, wherein the memory cells are arranged in a hexagonal pattern.

11. The memory cell array as recited in claim 10, further comprising bitlines connecting to the memory cells in the hexagonal pattern wherein the bitlines are arranged in a zig-zag pattern.

12. The memory cell array as recited in claim 10, further comprising bitlines connecting to the memory cells in the hexagonal pattern wherein the bitlines are arranged in substantially perpendicular to wordlines.

13. The memory cell array as recited in claim 10, further comprising bitlines connecting to the memory cells in the hexagonal pattern wherein the bitlines are arranged in a diagonal pattern relative to wordlines.

14. The memory cell array as recited in claim 9, wherein each memory cell has a cell area of about $4F^2$ where F is a feature size of the DRAM chip.

15. The memory cell array as recited in claim 9, wherein the same shapes include a same lithographically determined shape wherein a same lithographic mask determines the lithographically determined shape of the trenches, the active areas and the contacts.

16. The semiconductor device as recited in claim 2, wherein the contact electrically connects to the transistor at a contact area and the contact area includes a third characteristic dimension equal and parallel to the first and second characteristic dimensions.

17. A memory cell array for a DRAM chip, each memory cell comprising:

a vertically disposed transistor having an active area forming a channel for accessing a storage node, the storage node being disposed within a trench of each memory cell;

a contact couples the transistor to a bitline wherein the trench, the active area and the contact have same shapes for improving processing of the DRAM chip; and bitlines connecting to the memory cells which are arranged in a hexagonal pattern, the bitlines being arranged in a zig-zag pattern.

* * * * *